(12) United States Patent
Miyata et al.

(10) Patent No.: US 7,961,055 B2
(45) Date of Patent: Jun. 14, 2011

(54) PLL CIRCUIT AND OSCILLATOR DEVICE

(75) Inventors: Shinji Miyata, Kasugai (JP); Masahiro Tanaka, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 33 days.

(21) Appl. No.: 12/617,234

(22) Filed: Nov. 12, 2009

(65) Prior Publication Data
US 2010/0207694 A1    Aug. 19, 2010

(30) Foreign Application Priority Data

Feb. 19, 2009   (JP) ................. 2009-036463

(51) Int. Cl.
*H03B 5/06* (2006.01)
*H03B 5/36* (2006.01)
*H03L 3/00* (2006.01)
*H03L 7/06* (2006.01)
*H03L 7/10* (2006.01)

(52) U.S. Cl. ........... 331/18; 331/8; 331/17; 331/116 FE; 331/158; 331/173; 331/185

(58) Field of Classification Search ............... 331/1 A, 331/8, 16–18, 25, 116 R, 116 FE, 158, 159, 331/172, 173, 185, 186
See application file for complete search history.

(56) References Cited

U.S. PATENT DOCUMENTS
5,945,854 A * 8/1999 Sadowski ............. 327/156
6,154,097 A   11/2000 Yoshioka FOREIGN PATENT DOCUMENTS
JP    11-308103 A    11/1999
* cited by examiner

*Primary Examiner* — David Mis
(74) *Attorney, Agent, or Firm* — Arent Fox LLP

(57) ABSTRACT

A phase locked loop circuit includes an oscillator part configured to generate a reference signal by amplifying a signal generated by an oscillator, and a phase locked loop part configured to include a filter that outputs a control signal to a clock transmitting circuit that generates a clock signal in accordance with a phase difference between the reference signal and a feedback signal, wherein a drive capability of the oscillator part is controlled in accordance with the control signal.

10 Claims, 14 Drawing Sheets

PLL CIRCUIT AND OSCILLATOR DEVICE

CROSS-REFERENCE TO RELATED APPLICATION

This application is based upon and claims the benefit of priority of the prior Japanese Patent Application No. 2009-036463 filed on Feb. 19, 2009, the entire contents of which are incorporated herein by reference.

FIELD

The present application relates to a PLL (Phase Locked Loop) circuit and an oscillator device.

BACKGROUND

Typically, an electronic apparatus is provided with a logic circuit that performs signal processing and a PLL circuit that generates a clock signal used by the logic circuit to perform operations. FIG. 1 is an electric block diagram illustrating a configuration example of a conventional PLL circuit 50.

The PLL circuit 50 includes a PLL part 51 and a crystal oscillator circuit 52. In the PLL circuit 50, a reference signal Sr generated by the crystal oscillator circuit 52 is converted by the PLL part 51 into a clock signal Clk having a preset frequency (target frequency), and the clock signal Clk is output to an internal circuit (not illustrated).

The PLL part 51 includes first and second frequency dividers 55 and 56, a phase comparator 57, a charge pump 58, a loop filter 59, and a voltage controlled oscillator (VCO) 60 serving as a clock oscillator.

A clock signal Clk output from the VCO 60 is input to the first frequency divider 55. The first frequency divider 55 performs frequency dividing on the clock signal Clk input at a preset division ratio and outputs the signal as a feedback clock signal Sp to the phase comparator 57.

That is, the first frequency divider 55 receives the clock signal Clk to be output to a logic circuit as an external circuit (not illustrated) in order to perform feedback control, performs frequency dividing on the received clock signal Clk, and outputs the signal to the phase comparator 57.

A reference signal Sr output from the crystal oscillator circuit 52 is an input to the second frequency divider 56. The second frequency divider 56 performs frequency dividing on the reference signal Sr input at a preset division ratio and outputs the signal as a frequency-divided reference signal Srd to the phase comparator 57.

The feedback clock signal Sp output from the first frequency divider 55 and the frequency-divided reference signal Srd output from the second frequency divider 56 are input to the phase comparator 57. The phase comparator 57 compares the phase of the feedback clock signal Sp input with the phase of the frequency-divided reference signal Srd input, thereby detecting a phase difference therebetween, and outputs an up signal Sup and a down signal Sdo having a pulse width according to the phase difference to the charge pump 58. Here, the up signal Sup causes the charge pump 58 in the subsequent stage to output an H-level judgment signal Sj, whereas the down signal Sdo causes the charge pump 58 in the subsequent stage to output an L-level judgment signal Sj.

That is, when the frequency of the feedback clock signal Sp is equal to the frequency of the frequency-divided reference signal Srd, no phase difference occurs between the feedback clock signal Sp and the frequency-divided reference signal Srd. At this time, the phase comparator 57 outputs neither an up signal Sup nor a down signal Sdo. That is, when there is no phase difference between the feedback clock signal Sp and the frequency-divided reference signal Srd, the clock signal Clk has the preset frequency (target frequency). Therefore, the phase comparator 57 outputs neither an up signal Sup nor a down signal Sdo.

When the frequency of the feedback clock signal Sp is lower than the frequency of the frequency-divided reference signal Srd, a phase difference occurs between the feedback clock signal Sp and the frequency-divided reference signal Srd. At this time, the phase comparator 57 outputs an up signal Sup having a pulse width according to the phase difference.

That is, in the phase comparator 57, as the frequency of the feedback clock signal Sp is lower than the frequency of the frequency-divided reference signal Srd, the phase difference between the feedback clock signal Sp and the frequency-divided reference signal Srd is larger. At this time, the phase comparator 57 outputs an up signal Sup having a large pulse width according to the phase difference.

On the other hand, in the phase comparator 57, when the frequency of the feedback clock signal Sp is lower than the frequency of the frequency-divided reference signal Srd and as the frequencies of the both signals Sp and Srd are more approximate to each other, the phase difference between the feedback clock signal Sp and the frequency-divided reference signal Srd is smaller. At this time, the phase comparator 57 outputs an up signal Sup having a small pulse width according to the phase difference.

When the frequency of the feedback clock signal Sp is higher than the frequency of the frequency-divided reference signal Srd, a phase difference occurs between the feedback clock signal Sp and the frequency-divided reference signal Srd. At this time, the phase comparator 57 outputs a down signal Sdo having a pulse width according to the phase difference.

That is, in the phase comparator 57, as the frequency of the feedback clock signal Sp is higher than the frequency of the frequency-divided reference signal Srd, the phase difference between the feedback clock signal Sp and the frequency-divided reference signal Srd is larger. At this time, the phase comparator 57 outputs a down signal Sdo having a large pulse width according to the phase difference.

On the other hand, in the phase comparator 57, when the frequency of the feedback clock signal Sp is higher than the frequency of the frequency-divided reference signal Srd and as the frequencies of the both signals Sp and Srd are more approximate to each other, the phase difference between the feedback clock signal Sp and the frequency-divided reference signal Srd is smaller. At this time, the phase comparator 57 outputs a down signal Sdo having a small pulse width according to the phase difference.

In this way, the phase comparator 57 outputs an up signal Sup and/or a down signal Sdo for causing the feedback clock signal Sp to be approximate to the frequency-divided reference signal Srd, and operates to cause the frequency of the clock signal Clk to be approximate to the preset frequency (target frequency).

The up signal Sup and the down signal Sdo output from the phase comparator 57 are input to the charge pump 58. The charge pump 58 outputs a judgment signal Sj to the loop filter 59 on the basis of the up signal Sup and the down signal Sdo input thereto. Specifically, when the up signal Sup is input, the charge pump 58 outputs an H-level judgment signal Sj. On the other hand, when the down signal Sdo is input, the charge pump 58 outputs an L-level judgment signal Sj.

Therefore, when the frequency of the clock signal Clk is lower than the preset frequency (target frequency), the charge pump 58 outputs an H-level judgment signal Sj. On the other hand, when the frequency of the clock signal Clk is equal to or higher than the present frequency (target frequency), the charge pump 58 outputs an L-level judgment signal Sj.

The judgment signal Sj output from the charge pump 58 is input to the loop filter 59. The loop filter 59 smoothes the judgment signal Sj input and outputs the signal as a control signal Slf to the VCO 60. When the L-level judgment signal Sj is output for a longer time than the time the H-level judgment signal Sj is output, the loop filter 59 decreases the voltage level of the control signal Slf. On the other hand, when the L-level judgment signal Sj is output for a shorter time than the time the H-level judgment signal Sj is output, the loop filter 59 increases the voltage level of the control signal Slf.

That is, when the frequency of the clock signal Clk is lower than the preset frequency (target frequency), the charge pump 58 increases the voltage level of the control signal Slf. On the other hand, when the frequency of the clock signal Clk is equal to or higher than the target frequency, the charge pump 58 decreases the voltage level of the control signal Slf.

The control signal Slf output from the loop filter 59 is input to the VCO 60. The VCO 60 changes the frequency of the clock signal Clk in accordance with the voltage level of the control signal Slf input thereto and outputs the clock signal Clk to the internal circuit and the first frequency divider 55. That is, the VCO 60 increases the frequency of the clock signal Clk, as the voltage level of the control signal Slf is higher, and outputs the clock signal Clk. Meanwhile, the VCO 60 decreases the frequency of the clock signal Clk, as the voltage level of the control signal Slf is lower, and outputs the clock signal Clk.

That is, the PLL part 51 repeats the above-described operation, causing the frequency of the clock signal Clk to match (e.g. be locked to) the preset frequency (target frequency). As illustrated in FIG. 2, the crystal oscillator circuit 52 includes a crystal oscillator 65, a feedback resistor 66, an inverting amplifier circuit 67 formed of a CMOS (Complementary Metal-Oxide Semiconductor) transistor, and a buffer circuit 68. The crystal oscillator 65 and the feedback resistor 66 are connected in parallel. Among nodes between the crystal oscillator 65 and the feedback resistor 66 (nodes N10 and N11), the node N10 is connected to an output terminal of the inverting amplifier circuit 67 and an input terminal of the buffer circuit 68, whereas the node N11 is connected to an input terminal of the inverting amplifier circuit 67.

With this configuration, in the crystal oscillator circuit 52, the inverting amplifier circuit 67 amplifies a sinusoidal signal output from the crystal oscillator 65 and outputs the signal as an amplified signal Sa to the buffer circuit 68. Accordingly, the crystal oscillator circuit 52 outputs the input amplified signal Sa as the reference signal Sr to the PLL part 51 via the buffer circuit 68.

In the crystal oscillator circuit 52, noise of a voltage level, according to a drive capability of the inverting amplifier circuit 67, is mixed in the reference signal Sr. Specifically, in the crystal oscillator circuit 52, noise in the reference signal Sr becomes larger as the drive capability of the inverting amplifier circuit 67 is higher. On the other hand, in the crystal oscillator circuit 52, noise in the reference signal Sr becomes smaller as the drive capability of the inverting amplifier circuit 67 is lower. Therefore, the PLL circuit 50 has a problem of generating a clock signal Clk on the basis of a reference signal Sr with noise, resulting in a poor jitter characteristic of the clock signal Clk due to fluctuations in a time axis direction at rising and falling edges of the clock signal Clk. Also, the PLL circuit 50 causes noise in a power supply as the drive capability is higher, causing a negative influence on other circuits, and causing a poor jitter characteristic of the clock signal Clk.

As a result, in order to improve the jitter characteristic of the clock signal Clk, it may be necessary to decrease the drive capability of the inverting amplifier circuit 67 of the crystal oscillator circuit 52 so as to reduce the noise in the reference signal Sr input from the crystal oscillator circuit 52. However, when the drive capability of the inverting amplifier circuit 67 of the crystal oscillator circuit 52 is decreased, crystal oscillation does not start, or time is taken to amplify a sinusoidal signal output from the crystal oscillator 65 of the crystal oscillator circuit 52. That is, no sinusoidal signal is output from the crystal oscillator 65, or it takes time to cause the sinusoidal signal output from the crystal oscillator 65 to have a voltage level necessary for a logic operation of the buffer circuit 68. For this reason, in the PLL circuit 50, the time when the frequency of the clock signal Clk does not match the preset frequency (target frequency) or the time for realizing match (lock) with the target frequency (lockup time) is long.

Under such circumstances, in the conventional crystal oscillator circuit 52, the drive capability of the inverting amplifier circuit 67 is switched, at startup, when the crystal oscillator circuit 52 is being started and, in a normal state, when the crystal oscillator circuit 52 is outputting a reference signal Sr of a constant frequency. That is, in the crystal oscillator circuit 52, the drive capability of the inverting amplifier circuit 67 is equal to a conventional drive capability at startup, whereas the drive capability of the inverting amplifier circuit 67 is lower than the conventional drive capability in the normal state (e.g., Japanese Unexamined Patent Application Publication No. 11-308103).

In other words, at startup, the drive capability of the inverting amplifier circuit 67 of the crystal oscillator circuit 52 is equal to the conventional drive capability, so that the lockup time for causing the frequency of the clock signal Clk to match the preset frequency (target frequency) is substantially similar to in the conventional case in the PLL circuit 50. On the other hand, in a normal state, the drive capability of the inverting amplifier circuit 67 of the crystal oscillator circuit 52 is lower than the conventional drive capability, so that the jitter characteristic of the clock signal Clk is improved in the PLL circuit 50.

FIG. 3 is a voltage waveform diagram of an amplified signal Sa output from the inverting amplifier circuit 67 of the crystal oscillator circuit 52. When the drive capability of the inverting amplifier circuit 67 is high (at startup), the amplified signal Sa output from the inverting amplifier circuit 67 rises and falls quickly, as in a waveform 70 illustrated in FIG. 3. On the other hand, when the drive capability of the inverting amplifier circuit 67 is low (in a normal state), the amplified signal Sa rises and falls slowly, as in a waveform 71 illustrated in FIG. 3. Then, when the amplified signal Sa is input to the buffer circuit 68, a large phase difference occurs between when the drive capability of the inverting amplifier circuit 67 is high (at startup) and when the drive capability is low (in a normal state). For example, assume that a threshold voltage of the buffer circuit 68 is half of a power-supply voltage Vcc, then a difference of time tb occurs between cases where the drive capability of the inverting amplifier circuit 67 is high and low.

That is, in the voltage level of the amplified signal Sa output from the inverting amplifier circuit 67 of the crystal oscillator circuit 52, the rise time and fall time thereof change in accordance with the drive capability of the inverting amplifier circuit 67 of the crystal oscillator circuit 52.

When the drive capability of the inverting amplifier circuit 67 of the crystal oscillator circuit 52 is switched at startup and in a normal state of the PLL circuit 50, the phase significantly changes, and thus the frequency of the clock signal Clk significantly departs from the frequency before the switch of the drive capability. As such, time is taken to recover the frequency before the switch of the drive capability, so that the PLL circuit 50 is incapable of stably outputting the clock signal Clk.

SUMMARY

According to an aspect of the embodiments, a phase locked loop circuit includes an oscillator part configured to generate a reference signal by amplifying a signal generated by an oscillator, and a phase locked loop part configured to include a filter that outputs a control signal to a clock transmitting circuit that generates a clock signal in accordance with a phase difference between the reference signal and a feedback signal, wherein a drive capability of the oscillator part is controlled in accordance with the control signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
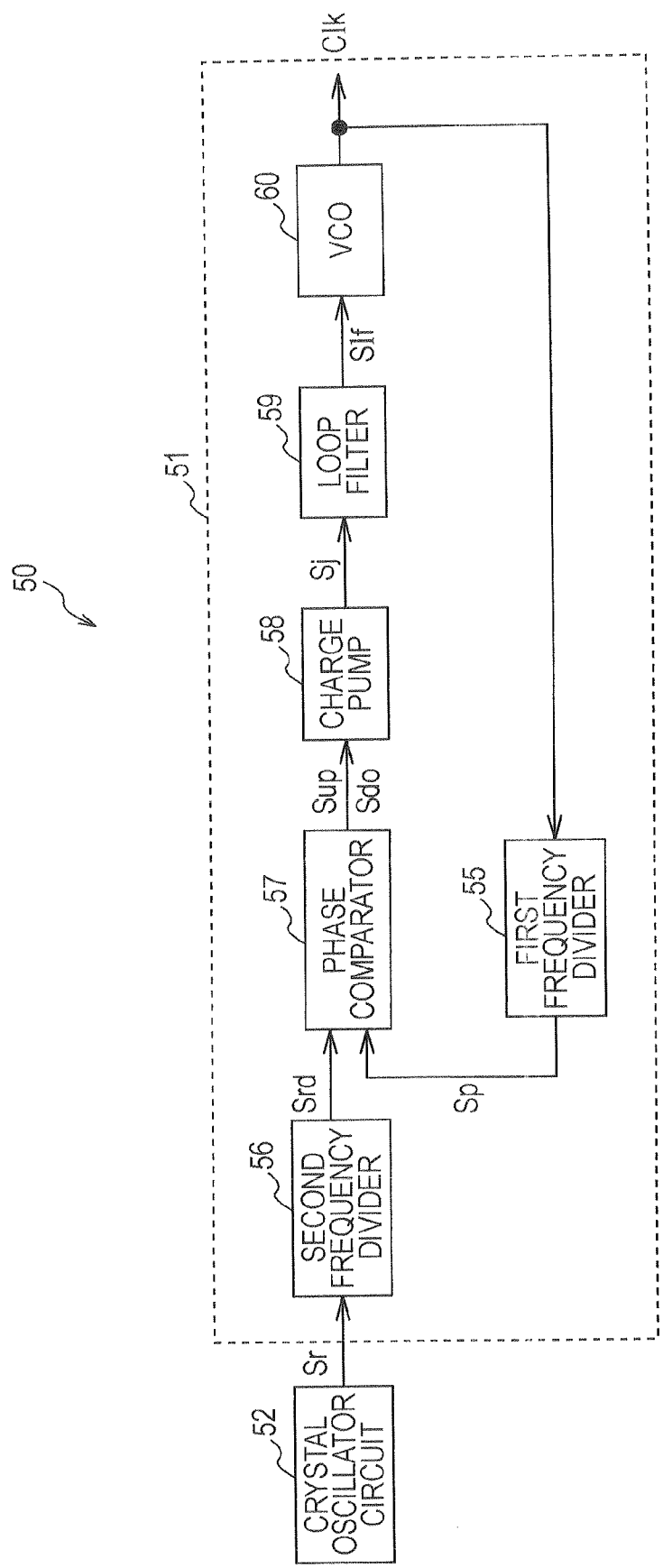
FIG. 1 illustrates a conventional PLL circuit.
Figure 2:
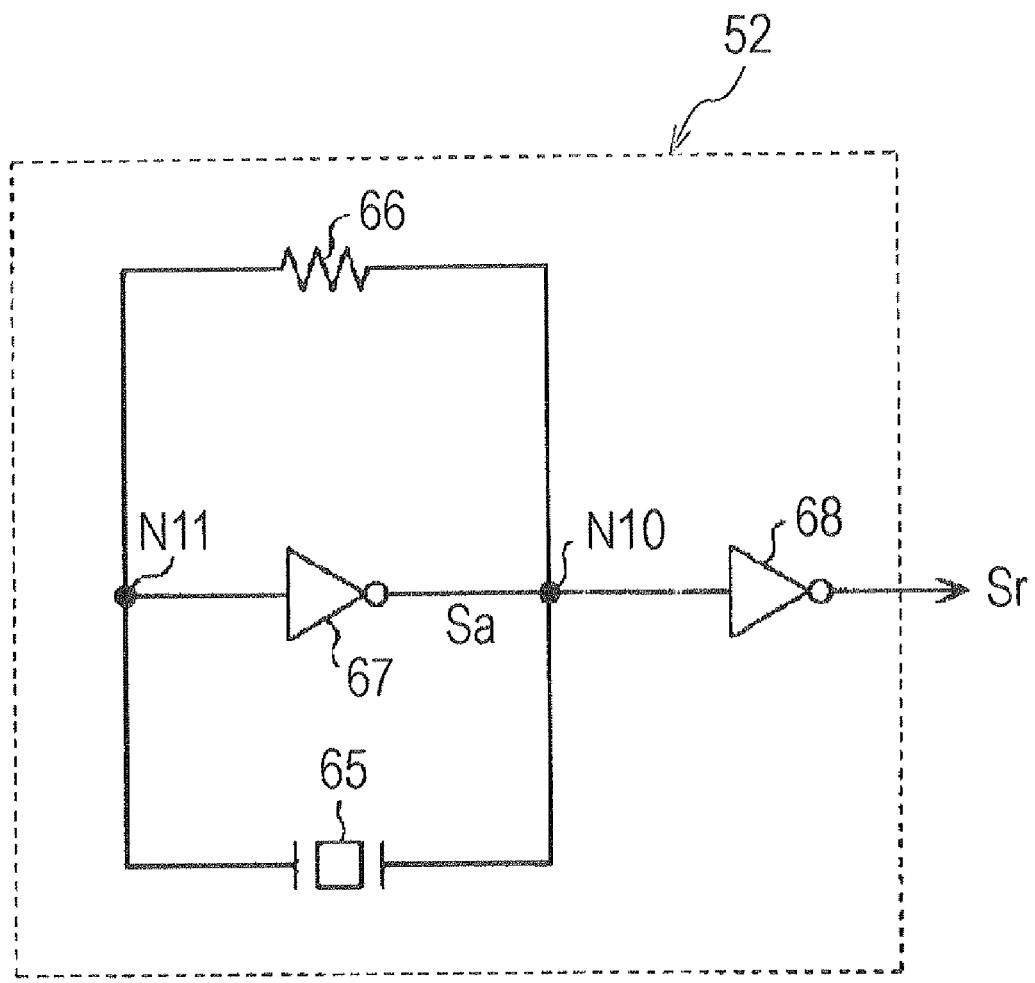
FIG. 2 illustrates a conventional crystal oscillator circuit.
Figure 4:
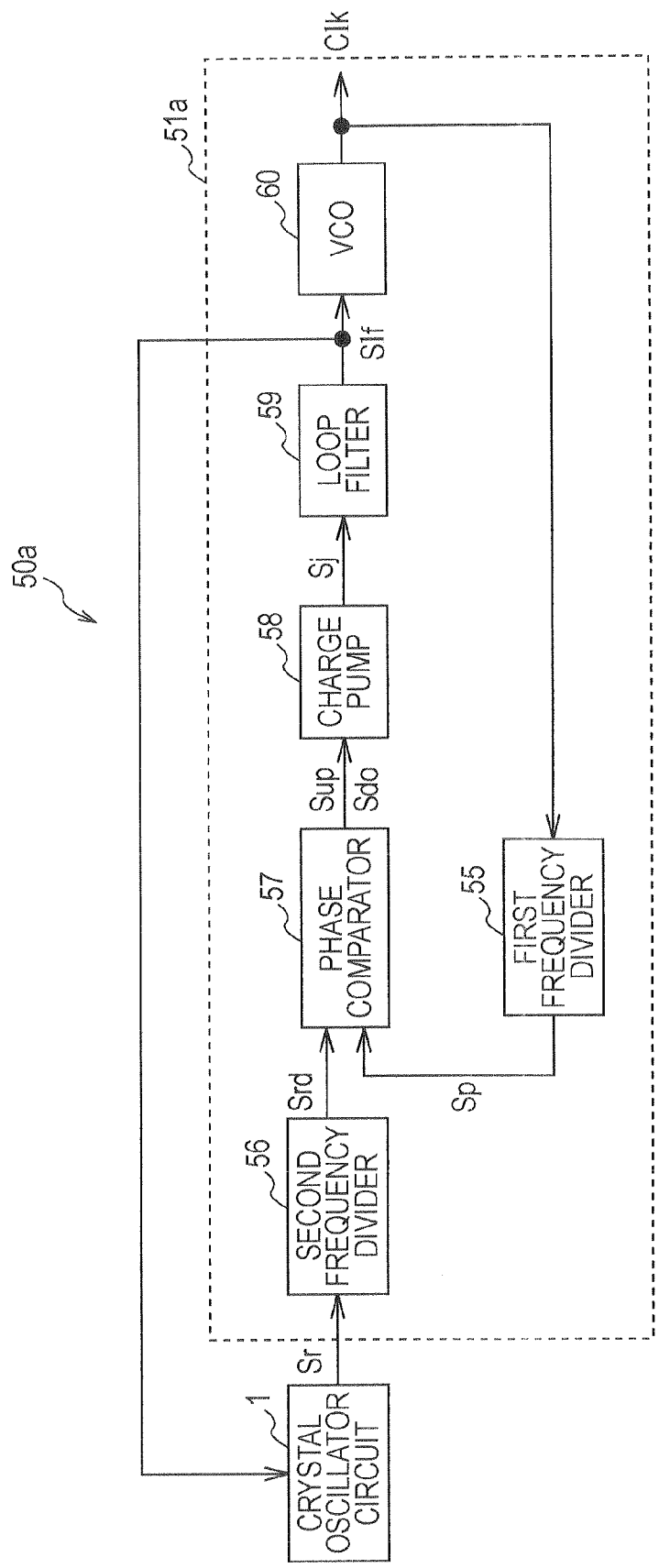
FIG. 4 illustrates a PLL circuit according to a first aspect of the invention.

Hereinafter, a first aspect will be described with reference to FIGS. 4 to 9. FIG. 4 illustrates an electric block circuit of a PLL circuit 50a according to this aspect. The PLL circuit 50a described in this aspect has a feature in a crystal oscillator circuit 1 serving as an oscillator part. The PLL part 51 illustrated in FIG. 1 may be applied as a PLL part 51a. Thus, a description will be given for the crystal oscillator circuit 1. The devices included in the PLL part 51a are denoted by the similar reference numerals and the corresponding description is omitted for convenience of description.

Figure 5:
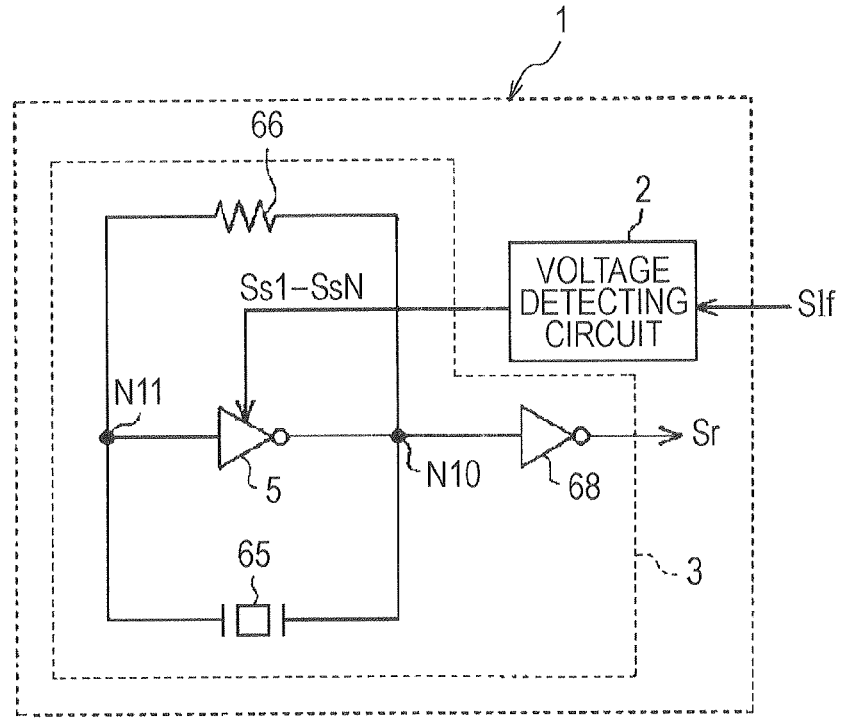
FIG. 5 illustrates a crystal oscillator circuit in FIG. 4.

FIG. 5 illustrates an electric block circuit of the crystal oscillator circuit 1 of the PLL circuit 50a. The crystal oscillator circuit 1 includes a voltage detecting circuit 2 and a crystal oscillator part 3. A control signal Slf output from the loop filter 59 is input to the voltage detecting circuit 2. The voltage detecting circuit 2 compares a voltage Vlf of the control signal Slf input with each of first to N-th reference voltages Vref1 to VrefN and outputs N comparison results as first to N-th set signals Ss1 to SsN to the crystal oscillator part 3.

Figure 8:
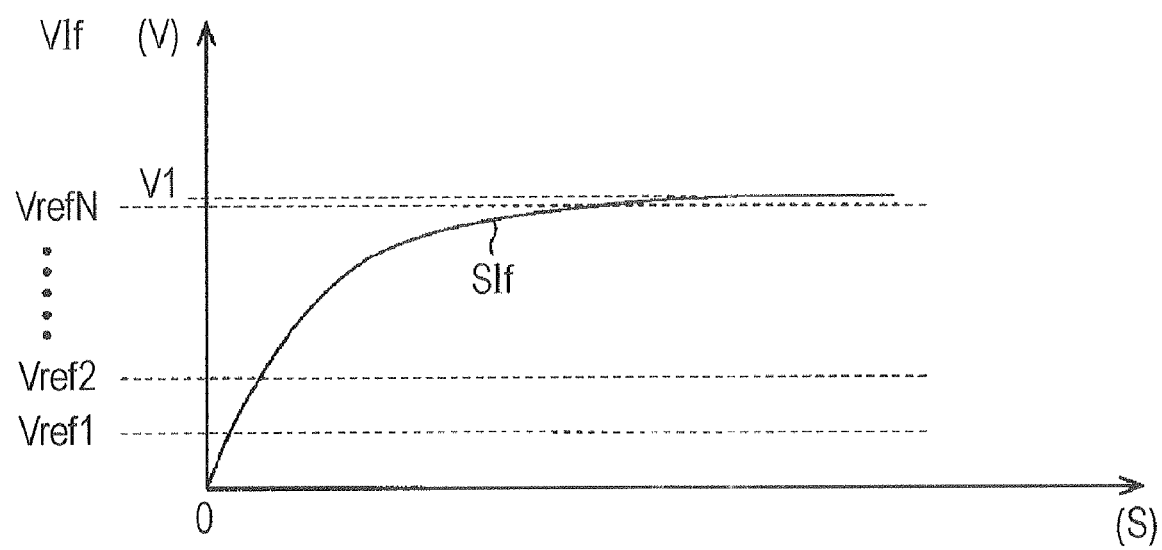
FIG. 8 is an explanatory diagram illustrating an operation of the PLL circuit in FIG. 4.

FIG. 8 illustrates relationships between the first to N-th reference voltages Vref1 to VrefN and the control signal Slf. When the PLL circuit 50a starts at time t0, the voltage Vlf of the control signal Slf gradually rises from 0 V to a target voltage value V1, that causes the frequency of a clock signal Clk to be a preset frequency (target frequency), and becomes constant at the target voltage value V1.

In other words, the PLL circuit 50a starts and gradually increases the frequency of the clock signal Clk until the frequency matches (is locked to) the target frequency, and the frequency becomes constant at the target frequency. The first to N-th reference voltages Vref1 to VrefN are reference voltages for dividing the range from 0 V to the N-th reference voltage VrefN into N sections. In this aspect, the N-th reference voltage VrefN is preset to a voltage value that is lower than the target voltage value V1 and that is substantially similar to the target voltage value V1.

Figure 6:
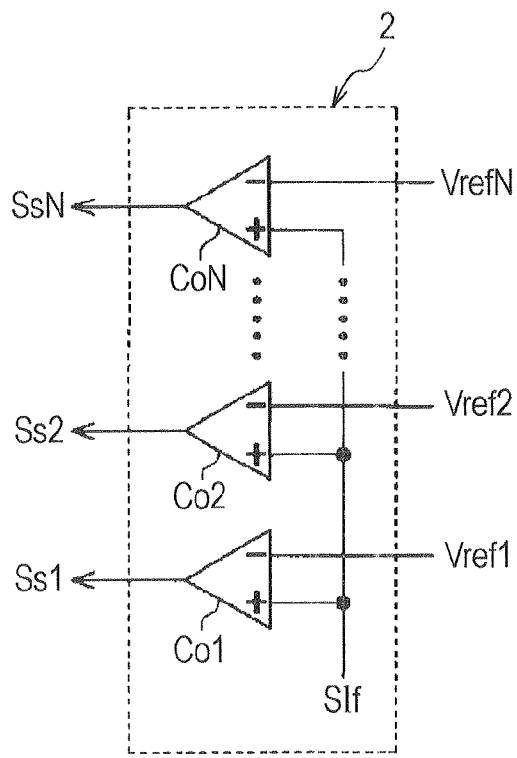
FIG. 6 illustrates a voltage detecting circuit in FIG. 5.

FIG. 6 illustrates an electric circuit of the voltage detecting circuit 2. The voltage detecting circuit 2 includes first to N-th comparator circuits Co1 to CoN corresponding to the first to N-th reference voltages Vref1 to VrefN, respectively.

The control signal Slf output from the loop filter 59 is input to each of non-inverting terminals of the first to N-th comparator circuits Co1 to CoN. Further, the corresponding first to N-th reference voltages Vref1 to VrefN are input to inverting input terminals of the first to N-th comparator circuits Co1 to CoN. Then, the respective comparator circuits Co1 to CoN compare the corresponding first to N-th reference voltages Vref1 to VrefN with the voltage Vlf of the control signal Slf, and output comparison results as first to N-th set signals Ss1 to SsN to the crystal oscillator part 3.

When the voltage Vlf of the control signal Slf is lower than the corresponding first to N-th reference voltages Vref1 to VrefN, the first to N-th comparator circuits Co1 to CoN output first to N-th set signals Ss1 to SsN of low (L) level, respectively. On the other hand, when the voltage Vlf of the control signal Slf is equal to or higher than the corresponding first to N-th reference voltages Vref1 to VrefN, the first to N-th comparator circuits Co1 to CoN output first to N-th set signals Ss1 to SsN of high (H) level, respectively.

Therefore, when the voltage Vlf of the control signal Slf gradually rises from 0 V to the target voltage value V1, as illustrated in FIG. 8, a first set signal Ss1, a second set signal Ss2, . . . , and an N-th set signal SsN that become H level from L level are output at respective timings in the order of the first comparator circuit Co1, the second comparator circuit Co2, . . . , and the N-th comparator circuit CoN.

In other words, when the voltage Vlf of the control signal Slf gradually rises from 0 V to the target voltage value V1, the first to N-th set signals Ss1 to SsN are sequentially inverted from L level to H level in the order of the first set signal Ss1, the second set signal Ss2, . . . , and the Nth set signal SsN.

Figure 7:
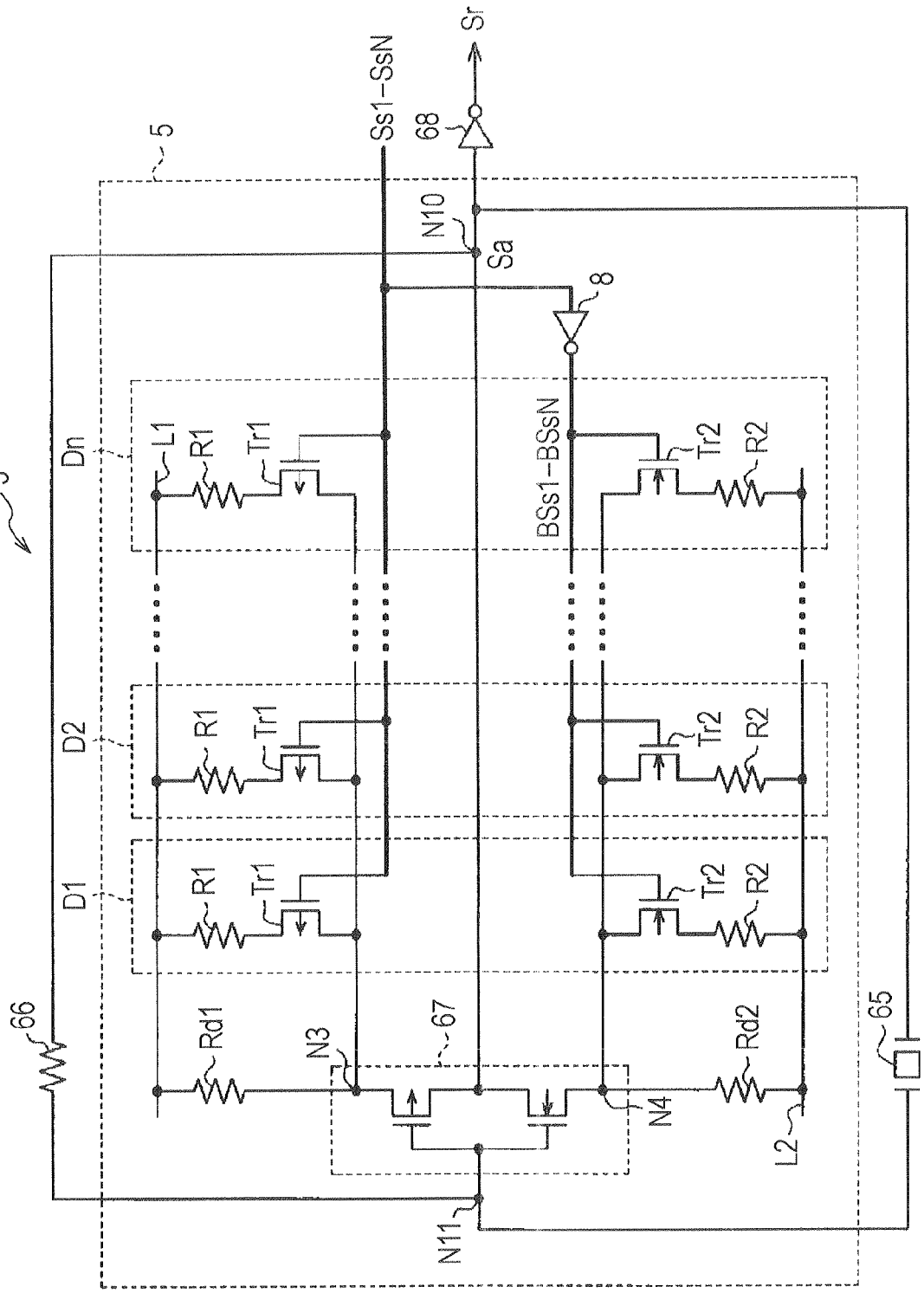
FIG. 7 is a circuit diagram illustrating a crystal oscillator part in FIG. 5.

FIG. 7 illustrates an electric circuit of the crystal oscillator part 3. The crystal oscillator part 3 includes a variable drive circuit 5 that is capable of controlling the drive capability of the inverting amplifier circuit 67 having a conventional CMOS structure. The variable drive circuit 5 includes the inverting amplifier circuit 67 serving as a drive part, an inverter circuit 8, a first drive resistor Rd1, a second drive resistor Rd2, and first to N-th variable drive parts D1 to Dn as adjusting parts provided as variable resistor parts corresponding to the first to N-th comparator circuits Co1 to CoN.

The inverting amplifier circuit 67 formed of a CMOS transistor is connected to the crystal oscillator 65 and the feedback resistor 66, as in the above-described related art. The first drive resistor Rd1 is connected between the inverting amplifier circuit 67 and a power-supply voltage line L1, and the second drive resistor Rd2 is connected between the inverting amplifier 67 and a ground line L2. That is, the resistance values of the first and second drive resistors Rd1 and Rd2 decrease the drive capability of the inverting amplifier circuit 67 to lower than that in the related art.

The first to N-th variable drive parts D1 to Dn have the similar circuit configuration, including first and second resistors R1 and R2, a first transistor Tr1, which is a P-channel MOS transistor, and a second transistor Tr2, which is an N-channel transistor.

The drains of the first transistors Tr1 of the variable drive parts D1 to Dn are connected to a node N3 between the inverting amplifier circuit 67 and the first drive resistor Rd1. The sources of the first transistors Tr1 of the variable drive parts D1 to Dn are connected to the power-supply voltage line L1 via the first resistors R1. Also, the drains of the second transistors Tr2 of the variable drive parts D1 to Dn are connected to a node N4 between the inverting amplifier circuit 67 and the second drive resistor Rd2. The sources second transistors Tr2 of the variable drive parts D1 to Dn are connected to the ground line L2 via the second resistors R2.

The first to N-th set signals Ss1 to SsN of the first to N-th comparator circuits Co1 to CoN are input to the gates of the first transistors Tr1 of the corresponding first to N-th variable drive parts D1 to Dn. Also, inverted set signals BSs1 to BSsN of the first to N-th set signals Ss1 to SsN of the first to N-th comparator circuits Co1 to CoN are input to the gates of the second transistors Tr2 of the corresponding first to N-th variable drive parts D1 to Dn via the inverter circuit 8.

When the first to N-th set signals Ss1 to SsN of H level are output from the corresponding first to N-th comparator circuits Co1 to CoN to the first to N-th variable drive parts D1 to Dn, the first and second transistors Tr1 and Tr2 of the respective variable drive parts D1 to Dn are turned off. Conversely, when the first to N-th set signals Ss1 to SsN of L level are output from the corresponding first to N-th comparator circuits Co1 to CoN to the first to N-th variable drive parts D1 to Dn, the first and second transistors Tr1 and Tr2 of the respective variable drive parts D1 to Dn are turned on.

Therefore, when the voltage Vlf of the control signal Slf reaches the first reference voltage Vref1, the first set signal Ss1 changes from L level to H level, so that the first and second transistors Tr1 and Tr2 of the first variable drive part D1 are turned off. As a result, the resistance value between the power-supply voltage line L1 and the node N3 changes from a resistance value of a parallel circuit including the first drive resistor Rd1 and the first resistors R1 of the first to N-th variable drive parts D1 to Dn, to a resistance value of a parallel circuit including the first drive resistor Rd1 and the first resistors R1 of the second to N-th variable drive parts D2 to Dn. Also, the resistance value between the ground line L2 and the node N4 changes from a resistance value of a parallel circuit including the second drive resistor Rd2 and the second resistors R2 of the first to N-th variable drive parts D1 to Dn, to a resistance value of a parallel circuit including the second drive resistor Rd2 and the second resistors R2 of the second to N-th variable drive parts D2 to Dn.

When the voltage Vlf of the control signal Slf is equal to or higher than the third reference voltage Vref3 and is lower than the fourth reference voltage Vref4, the first to third set signals Ss1 to Ss3 become H level, so that the first and second transistors Tr1 and Tr2 of the first to third variable drive parts D1 to D3 are turned off. As a result, the resistance value between the power-supply voltage line L1 and the node N3 changes to a resistance value of a parallel circuit including the first drive resistor Rd1 and the first resistors R1 of the fourth to N-th variable drive parts D4 to Dn. Further, the resistance value between the ground line L2 and the node N4 changes to a resistance value of a parallel circuit including the second drive resistor Rd2 and the second resistors R2 of the fourth to N-th variable drive parts D4 to Dn.

That is, during a gradual rise of the voltage Vlf of the control signal Slf from 0 V to the target voltage value V1, when the first to N-th set signals Ss1 to SsN are sequentially inverted from L level to H level in the order of the first set signal Ss1, the second set signal Ss2, . . . , and the Nth set signal SsN, the first and second transistors Tr1 and Tr2 of the first to N-th variable drive parts D1 to Dn are sequentially turned off.

In other words, as the first and second transistors Tr1 and Tr2 of the first to the N-th variable drive parts D1 to Dn are sequentially turned off, a composite resistance value between the power-supply voltage line L1 and the node N3 and a composite resistance value between the ground line L2 and the node N4 gradually change.

In this aspect, the drive capability of the variable drive circuit 5 becomes lower when the first and second transistors Tr1 and Tr2 of the first to N-th variable drive parts D1 to Dn are sequentially turned off.

The reason for this is as follows. The sequential turning off of the first and second transistors Tr1 and Tr2 of the first to N-th variable drive parts D1 to Dn decreases the number of first resistors R1 connected in parallel between the node N3 and the power-supply voltage line L1, and the number of second resistors R2 connected in parallel between the node N4 and the ground line L2. As a result, the resistance value between a node N10, which is an output node of the variable drive circuit 5, and the power-supply voltage line L1 increases, and also the resistance value between the node N10 and the ground L2 increases, so that the drive capability of the variable drive circuit 5 decreases.

Next, with reference to FIG. 9, an operation of the crystal oscillator circuit 1 of the PLL circuit 50a having the above-described configuration will be described. Before the PLL circuit 50a starts, a power-supply voltage Vcc is not applied to the crystal oscillator 65 of the crystal oscillator circuit 1, and an oscillation state has not occurred, so that the reference signal Sr is at 0 V. Also, the control signal Slf and the clock signal Clk are at 0 V as the reference signal Sr because those signals are generated on the basis of the reference signal Sr.

At time t0 when the power-supply voltage Vcc is supplied to the PLL circuit 50a, the PLL circuit 50a starts. Specifically, the power-supply voltage Vcc is supplied to the crystal oscillator 65 of the crystal oscillator circuit 1, whereby an oscillation state occurs. Then, the variable drive circuit 5 of the crystal oscillator circuit 1 amplifies a sinusoidal signal of the crystal oscillator 65. Accordingly, the amplitude of the amplified signal Sa output from the variable drive circuit 5 is increased.

Since the voltage Vlf of the control signal Slf is lower than the first reference voltage Vref1, all of the first to N-th set signals Ss1 to SsN are in L level. Therefore, the first drive resistor Rd1 and the first resistors R1 of the first to N-th variable drive parts D1 to Dn are connected between the inverting amplifier circuit 67 and the power-supply voltage line L1. Further, the second drive resistor Rd2 and the second resistors R2 of the first to N-th variable drive parts D1 to Dn are connected between the inverting amplifier circuit 67 and the ground line L2. In this state, the drive capability of the variable drive circuit 5 of the crystal oscillator circuit 1 is at its highest.

As a result, an amplification rate for amplifying the sinusoidal signal of the crystal oscillator 65 increases whereby the buffer circuit 68 starts an operation quickly, although noise of the reference signal Sr is large, that is, although the jitter characteristic of the clock signal Clk is poor.

In other words, at startup of the PLL circuit 50a, the drive capability of the variable drive circuit 5 is allowed to be at its highest, whereby the lockup time of the PLL circuit 50a is shortened. At this time, the clock signal Clk is output with a slight delay from the supply of the power-supply voltage Vcc at time to.

Then, at time t1 when the voltage of the amplified signal Sa output from the variable drive circuit 5 of the crystal oscillator circuit 1 reaches the voltage Vlf that may be necessary for operating the buffer circuit 68, the buffer circuit 68 outputs a reference signal Sr to the PLL part 51a.

Accordingly, the PLL part 51a operates on the basis of the reference signal Sr input thereto and raises the voltage Vlf of the control signal Slf. That is, in the PLL part 51a, the frequency of a feedback clock signal Sp, which is a feedback signal of the clock signal Clk, is lower than the frequency of the reference signal Sr. Thus, the PLL part 51a increases the voltage Vlf of the control signal Slf so that the frequency of the feedback clock signal Sp becomes approximately equal to the frequency of the reference signal Sr.

Then, at time t2 when the voltage Vlf of the control signal Slf becomes equal to the first reference voltage Vref1, the drive capability of the variable drive circuit 5 decreases by one step. That is, the first resistor R1, of the first variable drive part D1, is separated from the first drive resistor Rd1 and the first resistors R1 of the first to N-th variable drive parts D1 to Dn connected in parallel between the inverting amplifier circuit 67 and the power-supply voltage line L1. Also, the second resistor R2, of the first variable drive part D1, is separated from the second drive resistor Rd2 and the second resistors R2 of the first to N-th variable drive parts D1 to Dn connected in parallel between the inverting amplifier circuit 67 and the ground line L2. Accordingly, the drive capability of the variable drive circuit 5 decreases in accordance with the separated first and second resistors R1 and R2. As a result, the noise of the reference signal Sr becomes smaller than that before the drive capability of the variable drive circuit 5 is decreased by one step, so that the jitter characteristic of the clock signal Clk is improved.

Then, at time 3 when the voltage Vlf of the control signal Slf becomes equal to the second reference voltage Vref2, the drive capability of the variable drive circuit 5 further decreases by one step. That is, the first resistor R1, of the second variable drive part D2, is separated from the first drive resistor Rd1 and the first resistors R1 of the second to N-th variable drive parts D2 to Dn connected in parallel between the inverting amplifier circuit 67 and the power-supply voltage line L1. Also, the second resistor R2, of the second variable drive part D2, is separated from the second drive resistor Rd2 and the second resistors R2 of the second to N-th variable drive parts D2 to Dn connected in parallel between the inverting amplifier circuit 67 and the ground line L2. Accordingly, the drive capability of the variable drive circuit 5 decreases in accordance with the separated first and second resistors R1 and R2. Therefore, the noise of the reference signal Sr becomes smaller than that before the drive capability of the variable drive circuit 5 is decreased by one step, so that the jitter characteristic of the clock signal Clk is improved.

Then, as the voltage Vlf of the control signal Slf sequentially rises to the third to N-th reference voltages Vref3 to VrefN, the drive capability of the variable drive circuit 5 decreases stepwise accordingly. That is, the number of first resistors R1 connected in parallel to the first drive resistor Rd1 and the number of second resistors R2 connected in parallel to the second drive resistor Rd2 decrease, and the drive capability of the variable drive circuit 5 further decreases in accordance with the decrease in the first and second resistors R1 and R2. Accordingly, the noise of the reference signal Sr becomes smaller than that before the drive capability of the variable drive circuit 5 is decreased by one step, so that the jitter characteristic of the clock signal Clk is improved.

Then, as time t4 when the voltage Vlf of the control signal Slf becomes equal to the N-th reference voltage VrefN, the drive capability of the variable drive circuit 5 further decreases by one step. That is, the first drive resistor Rd1 remains between the inverting amplifier circuit 67 and the power-supply voltage line L1, and the second drive resistor Rd2 remains between the inverting amplifier circuit 67 and the ground line L2, so that the drive capability of the variable drive circuit 5 further decreases in accordance with the first and second resistors R1 and R2. Accordingly, the noise of the reference signal Sr becomes smaller than that before the drive capability of the variable drive circuit 5 is decreased by one step, so that the jitter characteristic of the clock signal Clk is improved.

At this time, the first drive resistor Rd1 is connected between the inverting amplifier circuit 67 and the power-supply voltage line L1, and the second drive resistor Rd2 is connected between the inverting amplifier circuit 67 and the ground line L2. That is, the drive capability of the variable drive circuit 5 is at its lowest. Accordingly, when the clock signal Clk matches (is locked to) the target frequency, the jitter characteristic of the clock signal Clk is most favorable.

Figure 9:
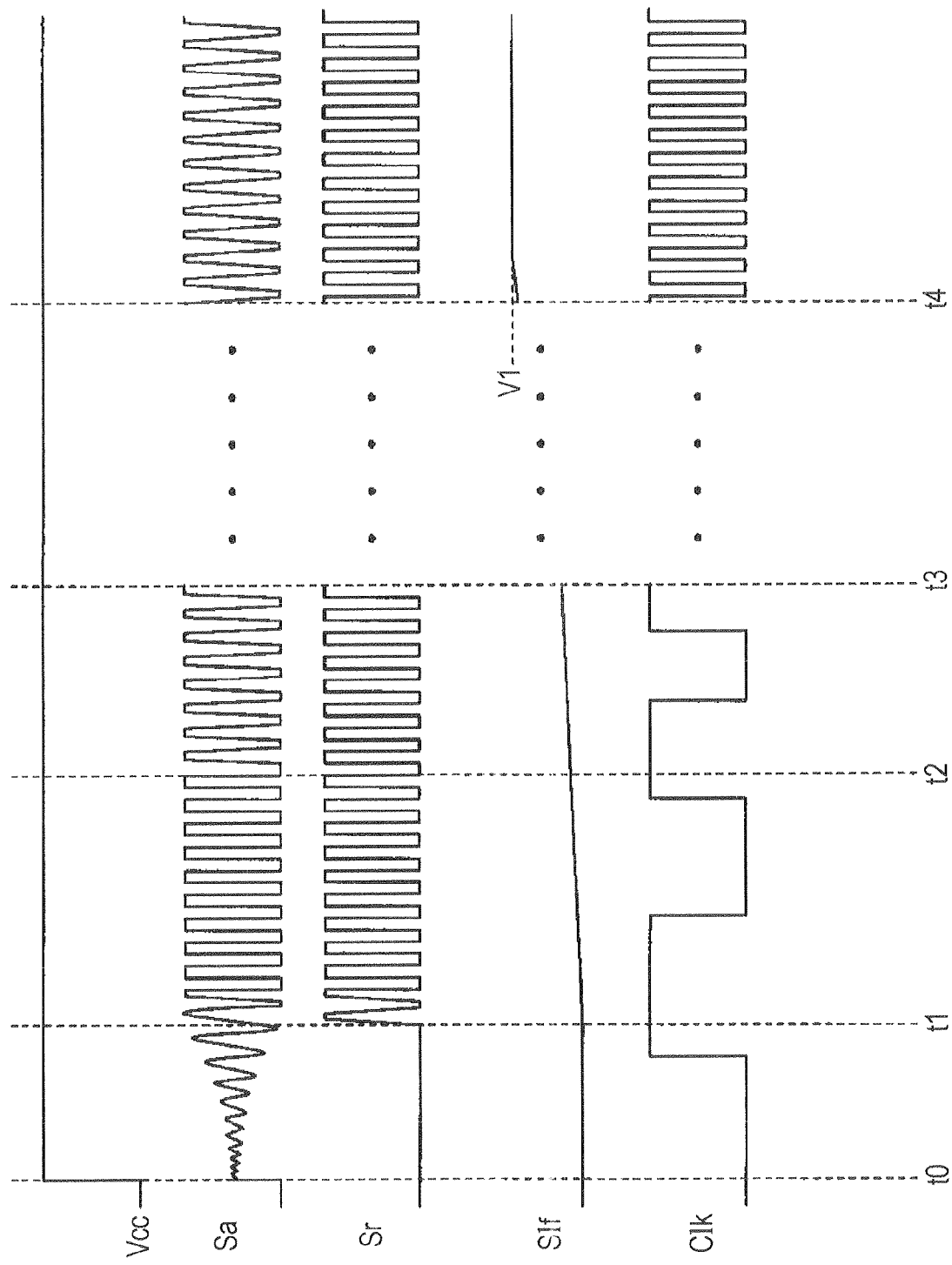
FIG. 9 is a first explanatory diagram illustrating an operation of the crystal oscillator circuit in FIG. 5.

Therefore, as illustrated in FIG. 9, the drive capability of the variable drive circuit 5 decreases stepwise in accordance with a rise of the voltage Vlf of the control signal Slf. As a result, when the drive capability of the variable drive circuit 5 is decreased by one step, the phase of the reference signal Sr slightly changes, the frequency of the clock signal Clk slightly deviates from the frequency before the change of the drive capability, and the frequency of the clock signal Clk can be quickly recovered to the frequency of the clock signal Clk before the change of the drive capability. That is, the PLL circuit 50a is capable of stably outputting the clock signal Clk.

As described above, according to this aspect, the following advantages can be obtained. In the crystal oscillator circuit 1, the drive capability of the variable drive circuit 5 is higher as the voltage Vlf of the control signal Slf is lower. In other words, the drive capability of the variable drive circuit 5 is lower as the voltage Vlf of the control signal Slf is higher. In addition, the variable drive circuit 5 increases/decreases the drive capability stepwise.

Therefore, in the PLL circuit 50a, a lockup time is shortened at startup, and the jitter characteristic of the clock signal Clk is improved in a normal state. Furthermore, in the PLL circuit 50a, the drive capability of the variable drive circuit 5 of the crystal oscillator circuit 1 is increased/decreased stepwise when the drive capability is switched, and thus the phase of the reference signal Sr output from the crystal oscillator circuit 1 slightly fluctuates.

Figure 10:
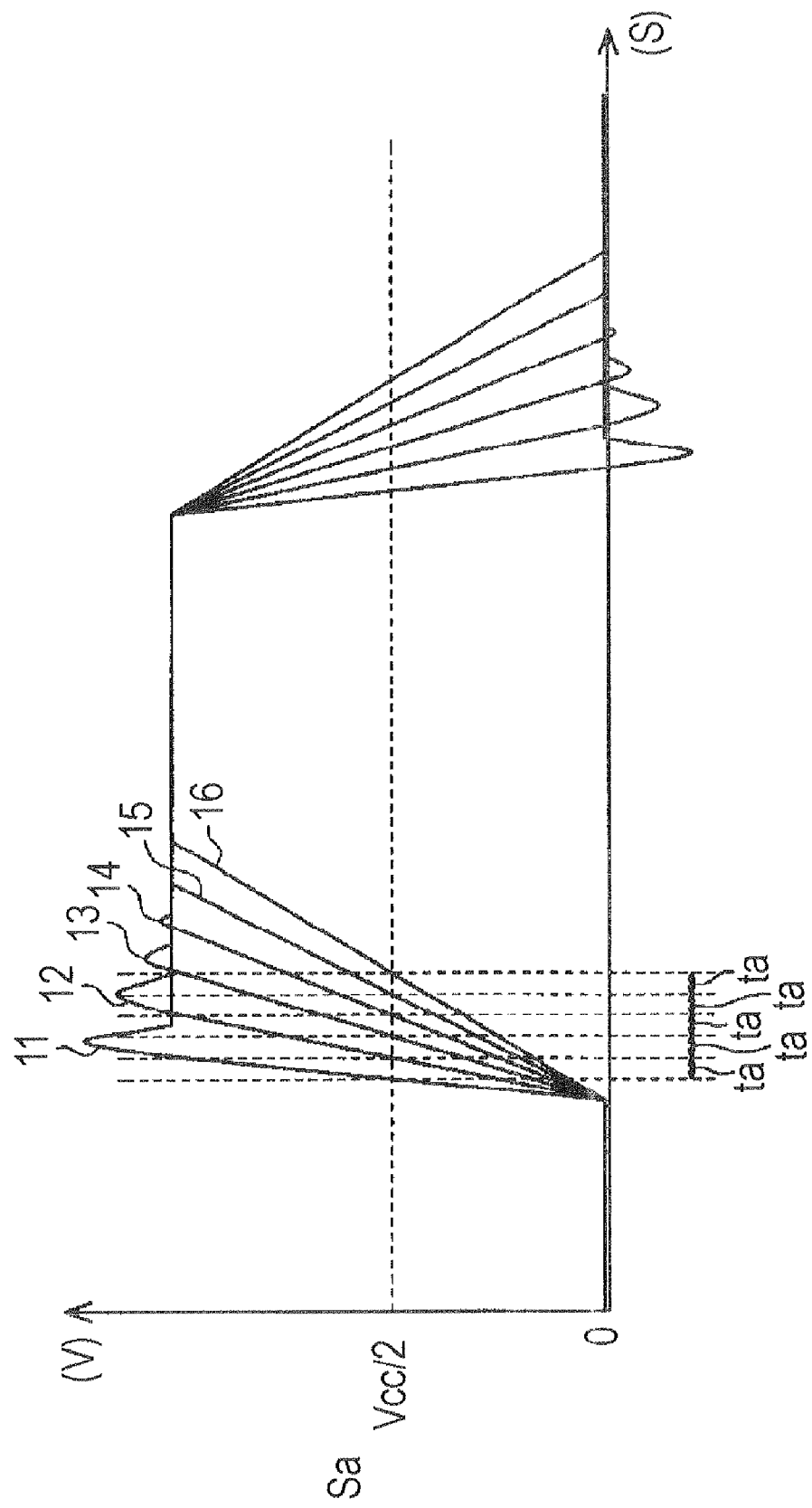
FIG. 10 is a second explanatory diagram illustrating an operation of the crystal oscillator circuit in FIG. 5.

Specifically, FIG. 10 is a voltage waveform diagram of the amplified signal Sa output from the variable drive circuit 5 of the crystal oscillator circuit 1. Waveforms 11 to 16 are voltage waveforms of the amplified signal Sa when the drive capability of the variable drive circuit 5 increases/decreases stepwise. In this aspect, the drive capability of the variable drive circuit 5 is increased/decreased in N steps. In FIG. 10, the drive capability of the variable drive circuit 5 is increased/decreased in six steps for convenience of description.

That is, the waveform 11 is a voltage waveform of the amplified signal Sa when the drive capability of the variable drive circuit 5 is the highest, the waveform 12 is a voltage waveform of the amplified signal Sa when the drive capability of the variable drive circuit 5 is the second highest, the waveform 13 is a voltage waveform of the amplified signal Sa when the drive capability of the variable drive circuit 5 is the third highest, the waveform 14 is a voltage waveform of the amplified signal Sa when the drive capability of the variable drive circuit 5 is the fourth highest, the waveform 15 is a voltage waveform of the amplified signal Sa when the drive capability of the variable drive circuit 5 is the fifth highest, and the waveform 16 is a voltage waveform of the amplified signal Sa when the drive capability of the variable drive circuit 5 is the lowest.

Figure 3:
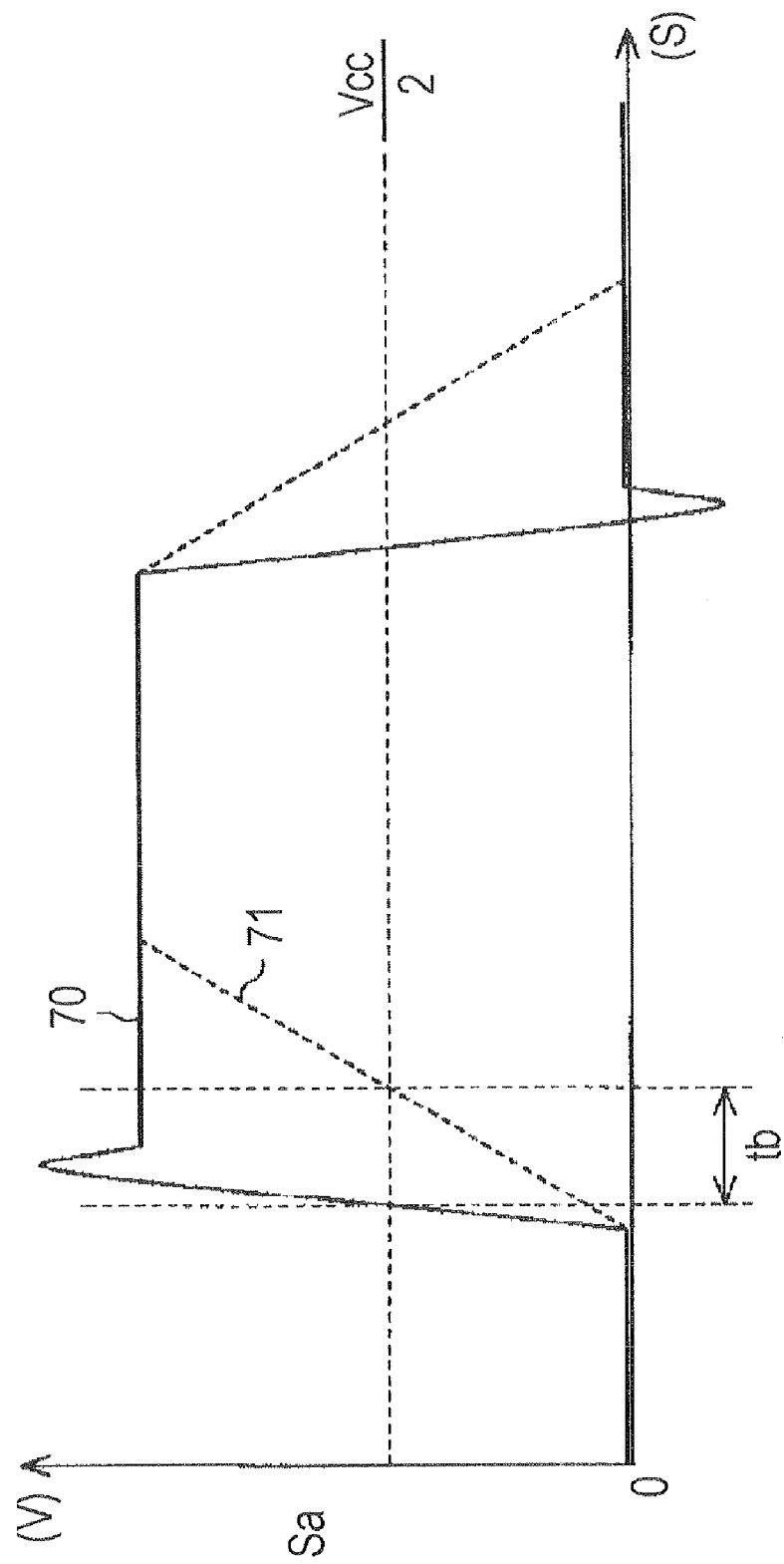
FIG. 3 is an explanatory diagram illustrating an operation of the conventional PLL circuit in FIG. 1.

Therefore, when the threshold of the buffer circuit 68 of the crystal oscillator circuit 1 is Vcc/2, the reference signal Sr fluctuates for time ta every time the drive capability of the variable drive circuit 5 increases/decreases by one step. It can be understood that the fluctuation time ta of the reference signal Sr is one fifth of the fluctuation time tb of the conventional amplified signal Sa illustrated in FIG. 3.

Also, the difference between phases of the frequency-divided reference signal Srd and the feedback clock signal Sp compared by the phase comparator 57 of the PLL part 51a becomes small. Accordingly, in the PLL circuit 50a, fluctuations of the frequency of the clock signal Clk can be suppressed compared to the related art when the drive capability of the variable drive circuit 5 is switched. As a result, the PLL circuit 50a is capable of stably outputting the clock signal Clk.

Hereinafter, a second aspect will be described with reference to FIG. 11. Unlike the above-described first aspect, the second aspect has a feature in that the drive capability of the crystal oscillator circuit 1 (variable drive circuit 5a) continuously increases/decreases in accordance with the voltage Vlf of the control signal Slf. Thus, the variable drive circuit 5a will be described in detail for convenience of description.

Figure 11:
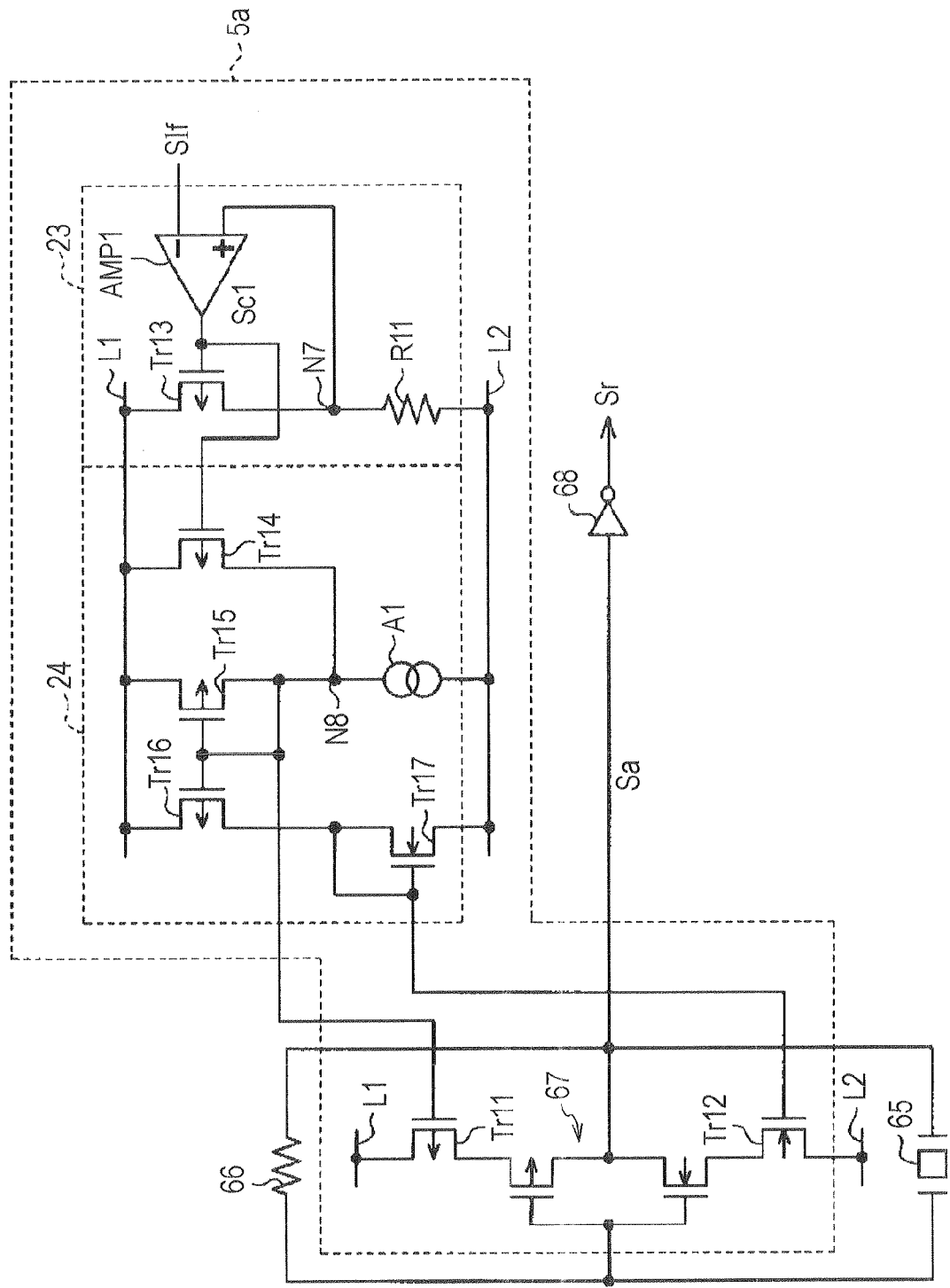
FIG. 11 illustrates a variable drive circuit according to a second aspect of the invention.

As illustrated in FIG. 11, the variable drive circuit 5a includes a voltage-to-current converting part 23, an output part 24, the inverting amplifier circuit 67, a first transistor Tr11, which is a P-channel MOS transistor, and a second transistor Tr12, which is an N-channel MOS transistor.

The voltage-to-current converting part 23 includes an amplifier circuit AMP1, a third transistor Tr13, which is a P-channel MOS transistor, and a first resistor R11. A non-inverting input terminal of the amplifier circuit AMP1 is connected to a node N7 between the third transistor Tr13 and the first resistor R11. An inverting input terminal receives the control signal Slf from the PLL part 51a. The amplifier circuit AMP1 outputs, from its output terminal, a first conversion signal Sc1, to a gate of the third transistor Tr13 and the output part 24.

The drain of the third transistor Tr13 is connected to the ground line L2 via the first resistor R11, and the source thereof is connected to the power-supply voltage line L1. With this configuration, the voltage-to-current converting part 23 increases/decreases the drain current of the third transistor Tr13 in accordance with the voltage Vlf of the control signal Slf. That is, as the voltage Vlf of the control signal Slf is higher, the amplifier circuit AMP1 of the voltage-to-current converting part 23 causes the voltage of the first conversion signal Sc1 to be lower and the drain current of the third transistor Tr13 to be larger. Conversely, as the voltage Vlf of the control signal Slf is lower, the amplifier circuit AMP1 causes the voltage of the first conversion signal Sc1 to be higher and the drain current of the third transistor Tr13 to be smaller. In other words, the voltage-to-current converting part 23 converts the voltage Vlf of the control signal Slf to the drain current of the third transistor Tr13.

The output part 24 includes fourth to sixth transistors Tr14 to Tr16, which are P-channel MOS transistors, a seventh transistor Tr17, which is an N-channel MOS transistor, and a constant current source A1.

The drain of the fourth transistor Tr14 is connected to a node N8 between the fifth transistor Tr15 and the constant current source A1. The source of the fourth transistor Tr14 is connected to the power-supply voltage line L1, and the first conversion signal Sc1 is input to the gate thereof from the output part 24.

That is, the fourth transistor Tr14 and the third transistor Tr13 of the voltage-to-current converting part 23 constitute a current mirror. Thus, the drain currents of the third and fourth transistors Tr13 and Tr14 have a current value based on the size ratio of the third and fourth transistors Tr13 and Tr14. For example, in a case where the size ratio of the third and fourth transistors Tr13 and Tr14 is 1:1, the drain currents have similar current values.

That is, the drain current of the fourth transistor Tr14 has a current value obtained by performing voltage-to-current conversion on the voltage Vlf of the control signal Slf. Therefore, as the voltage Vlf of the control signal Slf is higher, the drain current of the fourth transistor Tr14 is larger. Conversely, as the voltage Vlf of the control signal Slf is lower, the drain current of the fourth transistor Tr14 is smaller.

The gate and drain of the fifth transistor Tr15 are connected to each other, and the source thereof is connected to the power-supply voltage line L1. Thus, the drain current of the fifth transistor Tr15 has a current value corresponding to a value calculated by subtracting the drain current of the fourth transistor Tr14 from the constant current supplied from the constant current source A1.

That is, the relationship of the drain current of the fifth transistor Tr15 to the voltage Vlf of the control signal Slf is opposite to the relationship of the drain current of the fourth transistor Tr14 to the voltage Vlf of the control signal Slf. Specifically, as the voltage Vlf of the control signal Slf is higher, the drain current of the fifth transistor Tr15 is smaller. And conversely, as the voltage Vlf of the control signal Slf is lower, the drain current of the fifth transistor Tr15 is larger.

The drain of the sixth transistor Tr16 is connected to the drain of the seventh transistor Tr17 and the gates of the second and seventh transistors Tr12 and Tr17, and the source thereof is connected to the power-supply voltage line L1. The gate of the sixth transistor Tr16 is connected to the node N8 (the drain of the fourth transistor Tr14 and the gate of the fifth transistor Tr15). The gate and drain of the seventh transistor Tr17 are connected to each other, and the source thereof is connected to the ground line L2.

The fifth to seventh transistors Tr15 to Tr17 constitute a current mirror. Thus, the drain currents of the fifth to seventh transistors Tr15 to Tr17 have a current value based on the size ratio of the fifth to seventh transistors Tr15 to Tr17. For example, in a case where the size ratio of the fifth to seventh transistors Tr15 to Tr17 is 1:1:1, the drain currents have similar current values.

That is, as the voltage Vlf of the control signal Slf is higher, the output part 24 causes the drain currents of the fifth to seventh transistors Tr15 to TR17 to be smaller. And conversely, as the voltage level of the control signal Slf is lower, the output part 24 causes the drain currents of the fifth to seventh transistors Tr15 to Tr17 to be larger.

As in the first aspect, the inverting amplifier circuit 67 is formed of a CMOS transistor and is connected in parallel to the crystal oscillator 65 and the feedback resistor 66. The first transistor Tr11, which is a P-channel MOS transistor, is disposed between the inverting amplifier circuit 67 and the power-supply voltage line L1, and the second transistor Tr12, which is an N-channel MOS transistor, is disposed between the inverting amplifier circuit 67 and the ground line L2.

The drain of the first transistor Tr11 is connected to the inverting amplifier circuit 67, and the source thereof is connected to the power-supply voltage line L1. The gate of the first transistor Tr11 is connected to the node N8 (the drain of the fourth transistor Tr14, and the gates of the fifth and sixth transistors Tr15 and Tr16) included in the output part 24.

The drain of the second transistor Tr12 is connected to the inverting amplifier circuit 67, and the source thereof is connected to the ground line L2. The gate of the second transistor Tr12 is connected to the drain of the sixth transistor Tr16 (the drain and gate of the seventh transistor Tr17) included in the output part 24.

With this configuration, the first, fifth, and sixth transistors Tr11, Tr15, and Tr16 constitute a current mirror. Thus, the drain currents of the first, fifth, and sixth transistors Tr11, Tr15, and Tr16 have a current value based on the size ratio of the first, fifth, and sixth transistors Tr11, Tr15, and Tr16. For example, in a case where the size ratio of the first, fifth, and sixth transistors Tr11, Tr15, and Tr16 is 1:1:1, the drain currents have similar current values.

Therefore, as the voltage Vlf of the control signal Slf is lower, the variable drive circuit 5a causes the drain currents of the first and second transistors Tr11 and Tr12 to be larger. And conversely, as the voltage Vlf of the control signal Slf is higher, the variable drive circuit 5a causes the drain currents of the first and second transistors Tr11 and Tr12 to be smaller.

In other words, when the voltage Vlf of the control signal Slf is low (at startup), the variable drive circuit 5a increases the drive capability and quickly amplifies a sinusoidal signal output from the crystal oscillator 65. And conversely, when the voltage Vlf of the control signal Slf is high (in a normal state), the variable drive circuit 5a decreases the drive capability and reduces noise mixed in the reference signal Sr output from the buffer circuit 68.

As described above, according to this aspect, the following advantages are obtained. The variable drive circuit 5a increases/decreases the drive capability in accordance with the voltage Vlf of the control signal Slf.

Therefore, the variable drive circuit 5a is capable of suppressing fluctuation of the reference signal Sr output from the crystal oscillator circuit 1 when the drive capability is increased/decreased, compared to the first aspect. That is, in the first aspect, the variable drive circuit 5 increases/decreases the drive capability stepwise. In the second aspect, the variable drive circuit 5a continuously increases/decreases the drive capability, and thus fluctuation of the reference signal Sr output from the crystal oscillator circuit 1 can be suppressed when the drive capability is increased/decreased compared to the first aspect.

Furthermore, in the first aspect, the voltage detecting circuit 2 includes comparators the number of which corresponds to the number of steps of variations of the drive capability of the variable drive circuit 5. In the second aspect, the voltage detecting circuit 2 may not be used, and thus the circuit scale can be reduced.

Hereinafter, a third aspect will be described with reference to FIGS. 12 to 14. In the above-described first aspect, the PLL circuit 50a controls the frequency of the clock signal Clk by the VCO 60. In the third aspect, a PLL circuit 50b controls the frequency of the clock signal Clk by a current control oscillator (ICO) 30.

Figure 12:
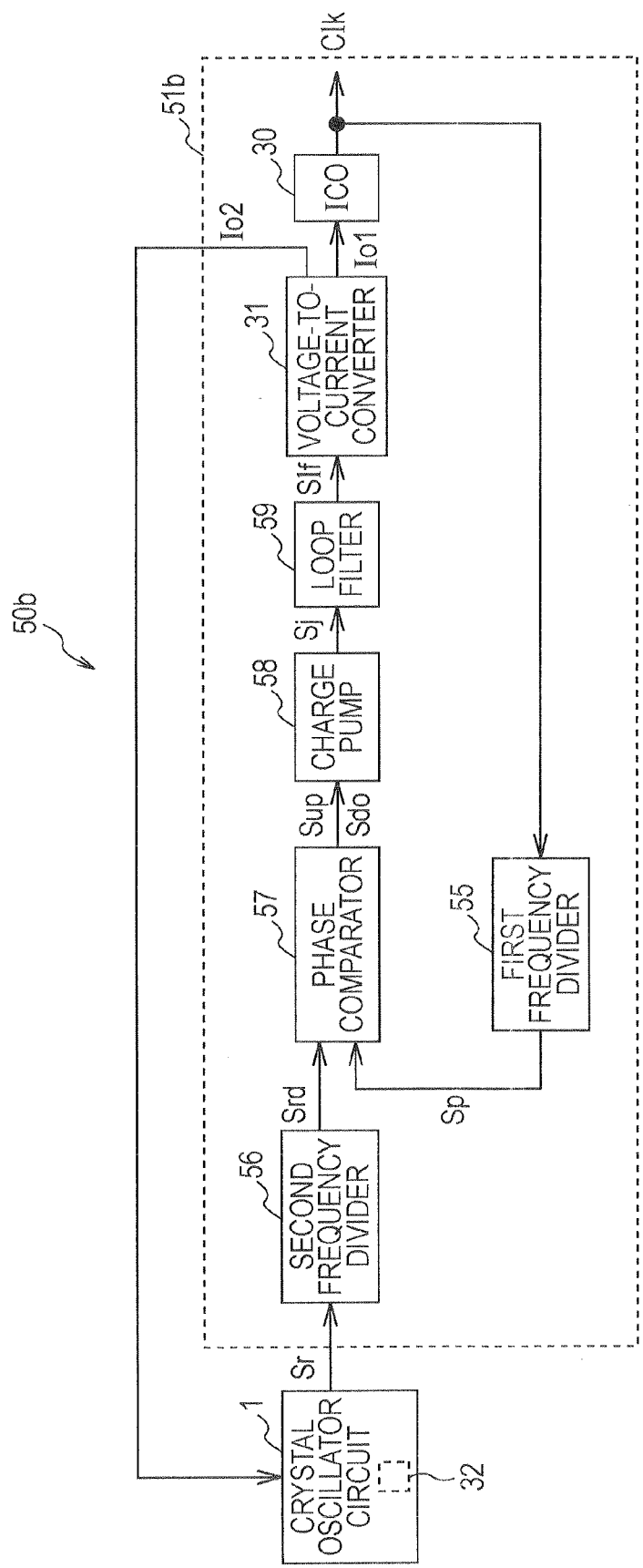
FIG. 12 illustrates a PLL circuit according to a third aspect of the invention.
Figure 13:
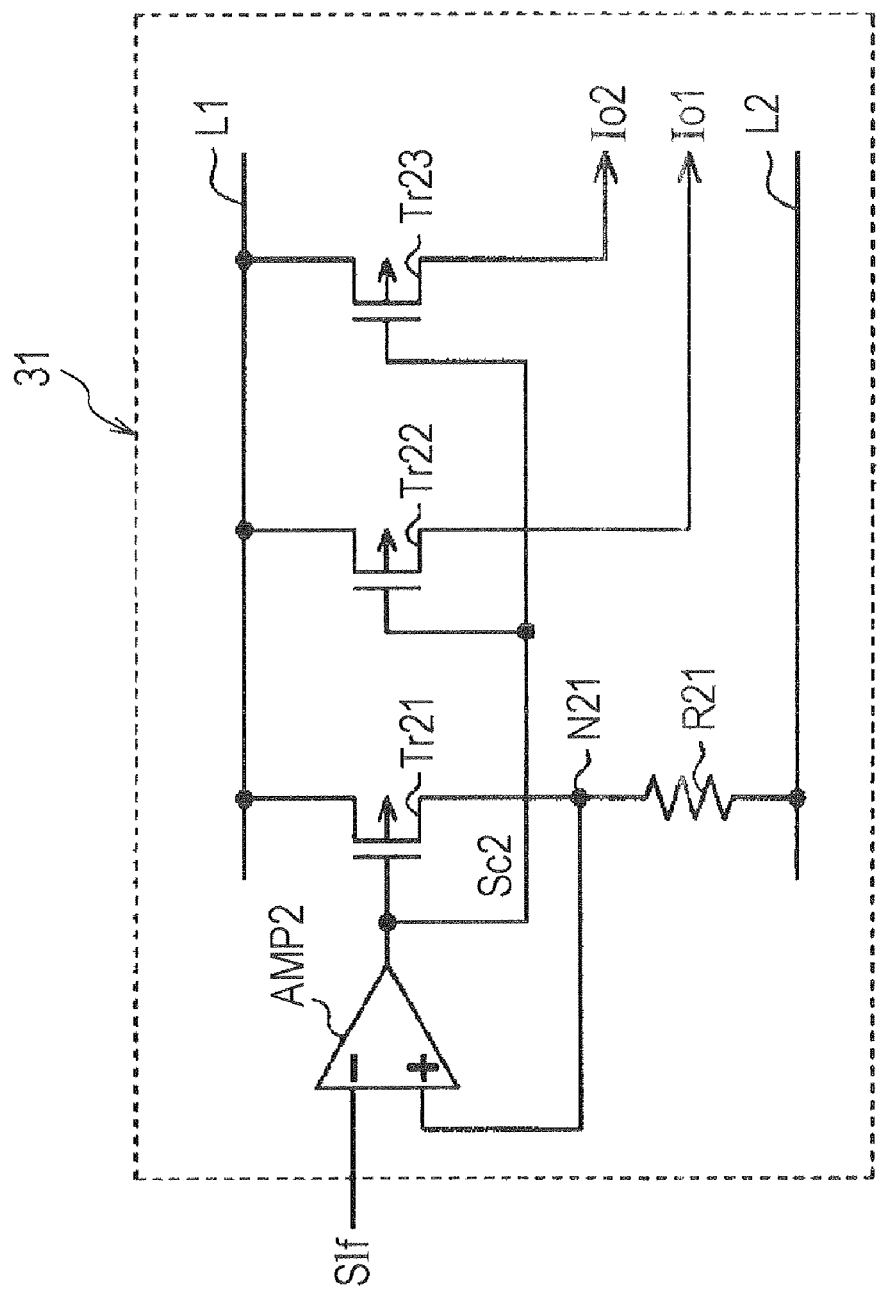
FIG. 13 illustrates an example of a voltage-to-current converter in FIG. 12.

Thus, as illustrated in FIG. 12, a PLL part 51b includes a voltage-to-current converter 31 that converts the voltage Vlf of the control signal Slf output from the loop filter 59 to a current value and that outputs first and second output currents Io1 and Io2 having the similar current value obtained through the conversion to the ICO 30 and the crystal oscillator circuit 1, respectively. With this change, the voltage detecting circuit 2 is replaced by a current detecting circuit 32 in the crystal oscillator circuit 1 of this aspect.

Other than the above-described points, the configuration of the third aspect is the similar to that of the first aspect, and thus the corresponding description is omitted for convenience of description. As illustrated in FIG. 13, the voltage-to-current converter 31 includes an amplifier circuit AMP2, first to third transistors Tr21 to Tr23, which are P-channel MOS transistors, and a first resistor R21.

A non-inverting input terminal of the amplifier circuit AMP2 is connected to a node N21 between the first transistor Tr21 and the first resistor R21, and an inverting input terminal thereof receives the control signal Slf from the loop filter 59. The amplifier circuit AMP2 outputs, from its output terminal, a second conversion signal Sc2 to the gates of the first to third transistors Tr21 to Tr23.

The drain of the first transistor Tr21 is connected to the ground line L2 via the first resistor R21, and the source of the first transistor Tr21 is connected to the power-supply voltage line L1. The drain of the second transistor Tr22 is connected to the ICO 30, and the drain current of the second transistor Tr22 (the first output current Io1) is output to the ICO 30. The source of the second transistor Tr22 is connected to the power-supply voltage line L1.

The drain of the third transistor Tr23 is connected to the current detecting circuit 32, and the drain current of the third transistor Tr23 (the second output current Io2) is output to the current detecting circuit 32. The source of third transistor Tr23 is connected to the power-supply voltage line L1.

The first to third transistors Tr21 to Tr23 constitute a current mirror. Thus, the drain currents of the first to third transistors Tr21 to Tr23 have a current value based on the size ratio of the first to third transistors Tr21 to Tr23. For example, in a case where the size ratio of the first to third transistors Tr21 to Tr23 is 1:1:1, the drain currents have similar current values.

The voltage-to-current converter 31 supplies the first and second output currents Io1 and Io2 in accordance with the voltage Vlf of the control signal Slf. That is, the voltage-to-current converter 31 causes the first and second output currents Io1 and Io2 to be larger as the voltage Vlf of the control signal Slf is higher. And conversely, as the voltage Vlf of the control signal Slf is lower, the voltage-to-current converter 31 causes the first and second output currents Io1 and Io2 to be smaller.

In other words, the voltage-to-current converter 31 converts the voltage Vlf of the control signal Slf to the first and second output currents Io1 and 102, outputs the first output current Io1 to the ICO 30, and outputs the second output current Io2 to the current detecting circuit 32. Thus, like the control signal Slf illustrated in FIG. 8, the first and second output currents Io1 and Io2 gradually rise from 0 A to a target current value that causes the clock signal Clk to have a preset frequency (target frequency) when the PLL circuit 50b starts, and become constant at the target current value.

Figure 14:
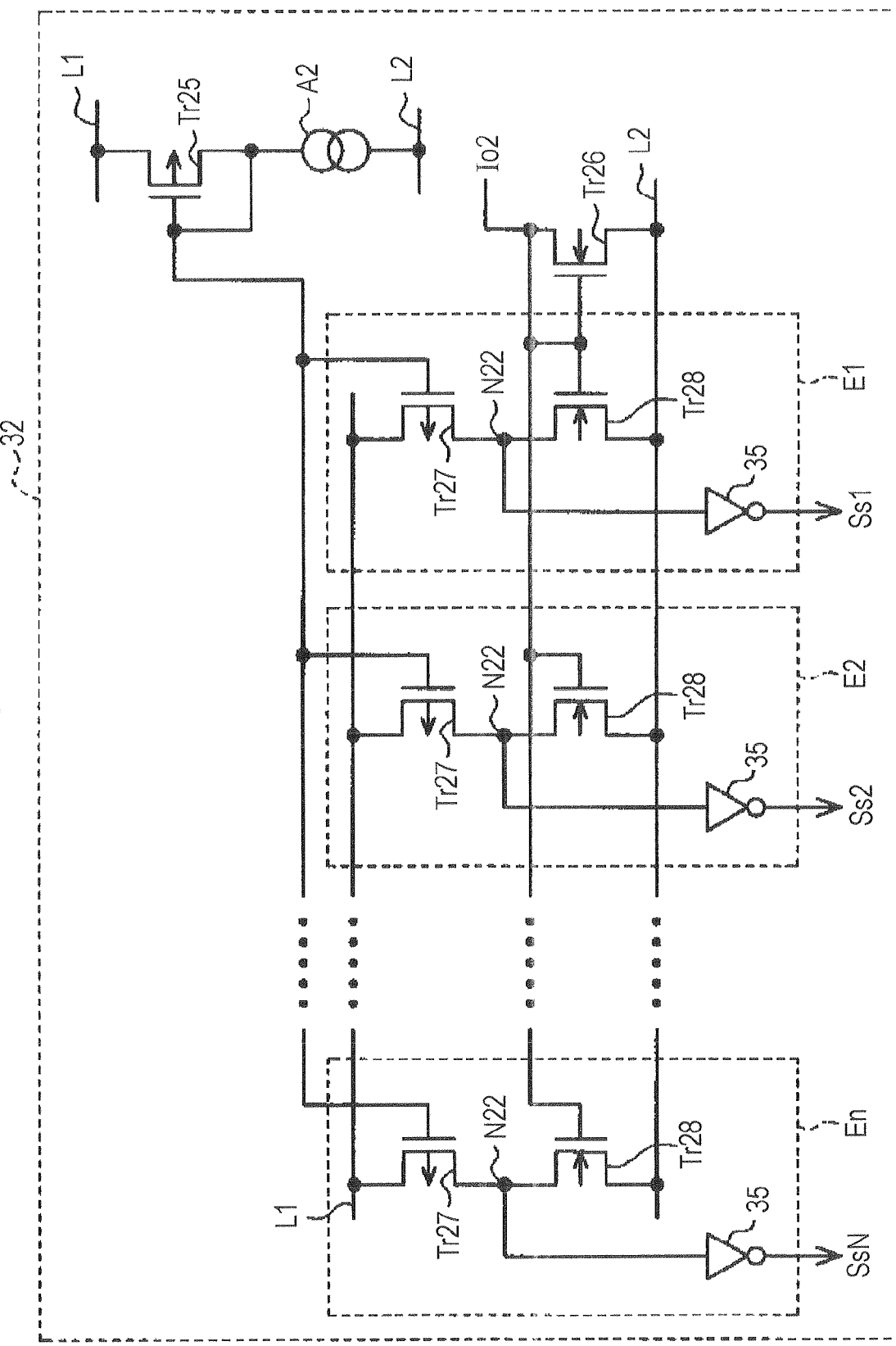
FIG. 14 illustrates an example of a current detecting circuit in FIG. 12.

As illustrated in FIG. 14, the current detecting circuit 32 includes a fifth transistor Tr25, which is a P-channel MOS transistor, a sixth transistor Tr26, which is an N-channel MOS transistor, a constant current source A2, and first to N-th current output parts E1 to En.

The drain and gate of the fifth transistor Tr25 are connected to each other and are connected to the ground line L2 via the constant current source A2. Also, the source of the fifth transistor Tr25 is connected to the power-supply voltage line L1. With this configuration, the drain current of the fifth transistor Tr25 has the similar current value as that of the constant current supplied from the constant current source A2.

The drain and gate of the sixth transistor Tr26 are connected to each other, and the second output current Io2 is input to the drain and gate from the voltage-to-current converter 31. Also, the source of the sixth transistor Tr26 is connected to the ground line L2. With this configuration, the drain current of the sixth transistor Tr26 has the similar current value as that of the second output current Io2 input thereto.

Each of the first to N-th current output parts E1 to En includes a seventh transistor Tr27, which is a P-channel MOS transistor, an eighth transistor Tr28, which is an N-channel MOS transistor, and an inverter circuit 35.

In each of the current output parts E1 to En, the drain of the seventh transistor Tr27 is connected to the drain of the eighth transistor Tr28 and an input terminal of the inverter circuit 35, and the source thereof is connected to the power-supply voltage line L1. The gate of the seventh transistor Tr27 is connected to the gate of the fifth transistor Tr25 and the gates of all the other seventh transistors Tr27 of the current output parts E1 to En.

In each of the current output parts E1 to En, the source of the eighth transistor Tr28 is connected to the ground line L2. The gate of the eighth transistor Tr28 is connected to the gate of the sixth transistor Tr26 and the gates of all the other eighth transistors Tr28 of the current output parts E1 to En.

With this configuration, the fifth and seventh transistors Tr25 and Tr27 constitute a current mirror. Therefore, the drain currents of the fifth and seventh transistors Tr25 and Tr27 have a current value based on the size ratio of the fifth and seventh transistors Tr25 and Tr27. For example, in a case where the size ratio of the fifth and seventh transistors Tr25 and Tr27 is 1:1, the drain currents have similar current values. Also, the sixth and eighth transistors Tr26 and Tr28 constitute a current mirror. Therefore, the drain currents of the sixth and eighth transistors Tr26 and Tr28 have a current value based on the size ratio of the sixth and eighth transistors Tr26 and Tr28. For example, in a case where the size ratio of the sixth and eighth transistors Tr26 and Tr28 is 1:1, the drain currents have similar current values.

The inverter circuits 35 of the current output parts E1 to En invert the potentials of nodes N22 between the seventh and eighth transistors Tr27 and Tr28 and output the inverted potentials as first to N-th set signals Ss1 to SsN to the variable drive circuit 5, illustrated in FIG. 5. Specifically, when the drain current of the seventh transistor Tr27 is equal to or larger than the drain current of the eighth transistor Tr28, the potential of the node N22 becomes H level, and the inverter circuit 35 outputs an L-level first set signal Ss1. Conversely, when the drain current of the seventh transistor Tr27 is smaller than the drain current of the eighth transistor Tr28, the potential of the node N22 becomes L level, and the inverter circuit 35 outputs an H-level first set signal Ss1.

In this way, the respective current output parts E1 to En compare the drain current of the seventh transistor Tr27 with the drain current of the eighth transistor Tr28 and determine logical values of the first to N-th set signals Ss1 to SsN to be output from the inverter circuits 35 of the current output parts E1 to En in accordance with the comparison results.

That is, in the respective current output parts E1 to En, when the drain current of the seventh transistor Tr27 is equal to or larger than the drain current of the eighth transistor Tr28, the potentials of the nodes N22 become H level, and the respective inverter circuits 35 output the first to Nth set signals Ss1 to SsN of L level. When the drain current of the seventh transistor Tr27 is smaller than the drain current of the eighth transistor Tr28, the potentials of the nodes N22 become L level, and the respective inverter circuits 35 output the first to N-th set signals Ss1 to SsN of H level.

In the first to N-th current output parts E1 to En, the transistors other than the seventh transistors Tr27 have the similar size. The gate sizes of the seventh transistors Tr27 of the first to N-th current output parts E1 to En increase in order from the first current output part E1 to the N-th current output part En.

Specifically, the gate sizes of the seventh transistors Tr27 are set so that the drain currents of the seventh transistors Tr27 increase in order from the first current output part E1 to the N-th current output part En. In this aspect, the drain currents of the seventh transistors Tr27 of the first to N-th current output parts E1 to En sequentially increase by integral multiple in order from the first current output part E1.

For example, the drain current of the seventh transistor Tr27 of the second current output part E2 is twice the drain current of the seventh transistor Tr27 of the first current output part E1. The drain current of the seventh transistor Tr27 of the third current output part E3 is three times the drain current of the seventh transistor Tr27 of the first current output part E1. Furthermore, the drain current of the seventh transistor Tr27 of the N-th current output part En is N times the drain current of the seventh transistor Tr27 of the first current output part E1.

The first to N-th set signals Ss1 to SsN output from the first to Nth current output parts E1 to En are inverted from L level to H level sequentially from the first set signal Ss1 in accordance with an increase in the second output current Io2.

That is, in the current detecting circuit 32, the number of L-level signals among the first to Nth set signals Ss1 to SsN becomes smaller as the second output current Io2 becomes larger. And conversely, the number of L-level signals among the first to N-th set signals Ss1 to SsN becomes larger as the second output current Io2 becomes smaller.

As a result, as the second output current Io2 becomes larger, the drive capability of the variable drive circuit 5, illustrated in FIG. 5, becomes lower, causing the voltage level of noise mixed in the reference signal Sr output from the crystal oscillator circuit 1 to be lower. Also, as the second output current Io2 becomes smaller, the drive capability of the variable drive circuit 5 becomes higher, causing the sinusoidal signal output from the crystal oscillator 65 of the crystal oscillator circuit 1 to be quickly amplified.

As described above, according to this aspect, the following advantages can be obtained. That is, the similar advantages as those in the first aspect can be obtained even in the above-described configuration of including the ICO 30 that increases/decreases the frequency of the clock signal Clk in accordance with a current value obtained through voltage-to-current conversion performed on the voltage Vlf of the control signal Slf.

Figure 15:
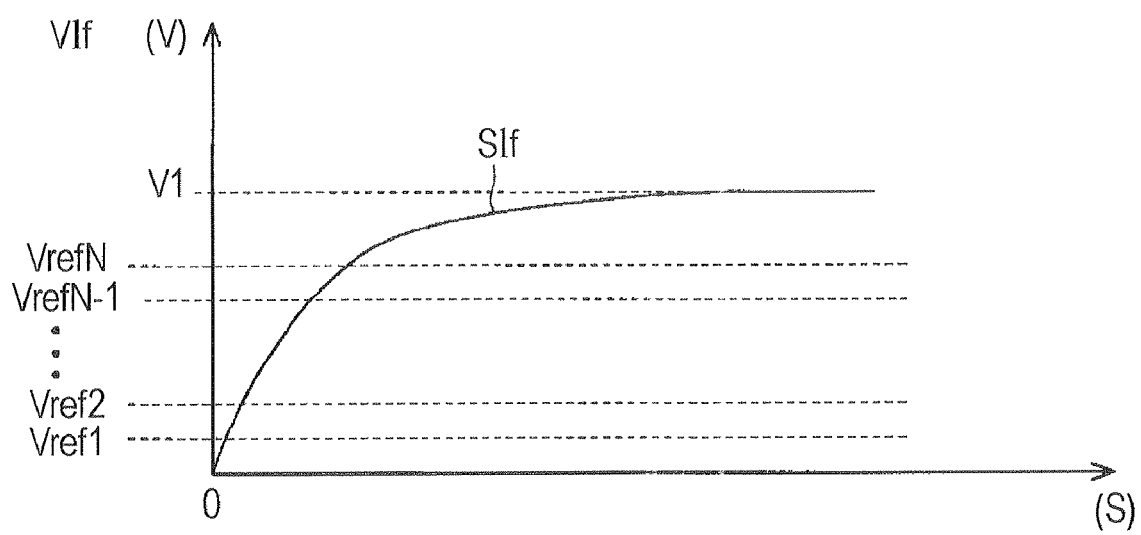
FIG. 15 is an explanatory diagram illustrating an operation of a crystal oscillator circuit according to a fourth aspect of the invention.

In addition, the above-described aspects can be carried out in the following manner. In the first aspect, the voltage detecting circuit 2 divides a range from 0 V to the voltage value that is lower than the target voltage value V1 causing the clock signal Clk to have the preset frequency (target frequency) and that is substantially similar to the target voltage value V1 into N sections, and detects the section in which the voltage level of the control signal Slf at the time is included. Alternatively, as illustrated in FIG. 15, the voltage detecting circuit 2 may divide a range where the control signal Slf steeply rises into N sections and may detect the section in which the voltage Vlf of the control signal Slf at the time is included.

Accordingly, in a state where the frequency of the clock signal Clk matches (is locked to) the target frequency, the voltage detecting circuit 2 does not change the detected section with respect to small fluctuation in voltage of the control signal Slf, such as fluctuation in voltage of the control signal Slf due to switching of the drive capability of the variable drive circuit 5. As a result, the PLL circuit 50a can maintain a state where the frequency of the clock signal Clk matches (is locked to) the target frequency.

In the third aspect, the current detecting circuit 32 divides a range from 0 A to the current value that is lower than the target current value causing the clock signal Clk to have the preset frequency (target frequency) and that is substantially similar to the target current value into N sections, and detects the section in which the current value of the control signal Slf at the time is included. Alternatively, the current detecting circuit 32 may divide a range where the first output current Io1 steeply rises into N sections and may detect the section in which the current value of the control signal Slf is included.

Accordingly, in a state where the frequency of the clock signal Clk matches (is locked to) the target frequency, the current detecting circuit 32 does not change the detected section with respect to small fluctuation of the first output current Io1 due to switching of the drive capability of the variable drive circuit 5. As a result, the PLL circuit 50b can maintain a state where the frequency of the clock signal Clk matches (is locked to) the target frequency. In the above-described aspects, the PLL parts 51a and 51b start an operation when the power-supply voltage Vcc is supplied thereto. Alternatively, the PLL parts 51a and 51b may start an operation after predetermined time has elapsed from supply of the power-supply voltage Vcc.

Specifically, the PLL parts 51a and 51b include a counter having a known circuit configuration for counting the reference signal Sr output from the crystal oscillator circuit 1. The counter starts counting the reference signal Sr when the power-supply voltage Vcc is supplied to the PLL parts 51a and 51b, and the operation of the PLL parts 51a and 51b may start after a preset time (e.g., 10 ms) has elapsed.

Accordingly, since the reference signal Sr is unstable in an initial state where the power-supply voltage Vcc is supplied, the crystal oscillator circuit 1 can start the operation of the PLL parts 51a and 51b after the unstable period has passed. As a result, the PLL circuits 50a and 50b can stably output the clock signal Clk. In the above-described aspects, the PLL circuits 50a and 50b can switch the drive capability of the variable drive circuits 5 and 5a of the crystal oscillator circuit 1 even after the frequency of the clock signal Clk matches (is locked to) the preset frequency (target frequency). Alternatively, the PLL circuits 50a and 50b may cause the drive capability of the variable drive circuit 5 of the crystal oscillator circuit 1 to be constant after the frequency of the clock signal Clk matches (is locked to) the target frequency.

Specifically, the PLL circuits 50a and 50b include a lock detector having a known circuit configuration for detecting that the frequency of the clock signal Clk matches (is locked to) the target frequency on the basis of an up signal Sup and a down signal Sdo output from the phase comparator 57. After the lock detector has detected lock, the drive capability of the variable drive circuit 5 of the crystal oscillator circuit 1 may be constant.

Accordingly, for example, when the frequency of the clock signal Clk matches (is locked to) the target frequency, the PLL circuits 50a and 50b can maintain the voltage Vlf of the control signal Slf even if the voltage level of the control signal Slf momentarily drops due to a momentary drop of the voltage Vlf of the control signal Slf. As a result, the PLL circuits 50a and 50b can maintain a state where the frequency of the clock signal Clk matches (is locked to) the target frequency. In the above-described aspects, the crystal oscillator circuit 1 changes the amplification rate of the sinusoidal signal output from the crystal oscillator 65 by changing the drive capability of the variable drive circuit 5. The crystal oscillator circuit 1 may change the amplification rate of the sinusoidal signal output from the crystal oscillator 65 by changing the resistance value of the feedback resistor 66. In the above-described aspects, the inverting amplifier circuit 67 is formed of a CMOS transistor. Alternatively, the inverting amplifier circuit 67 may be formed of a bipolar transistor.

According to the above-described aspects, the drive capability of a drive circuit of an oscillator part can be controlled in accordance with a control signal input to a clock oscillator. That is, the drive capability of the drive circuit is increased when the frequency of a clock signal of a PLL circuit deviates from a predetermined frequency, and the drive capability of the drive circuit is decreased when the frequency of the dock signal of the PLL circuit is approximate to the predetermined frequency. As a result, noise mixed in a reference signal can be reduced when the frequency of the clock signal of the PLL circuit is approximately the same as the predetermined frequency. Furthermore, a phase shift of the reference signal is reduced when the drive capability of the drive circuit is controlled. As a result, the PLL circuit can stably generate a clock signal on the basis of the reference signal. Although the aspects of the present invention are numbered with, for example, "first," "second," or "third," the ordinal numbers do not imply priorities of the aspects. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the aspect of the present invention has been described in detail, it should be understood that the various changes, substitutions, and alterations could be made hereto without departing from the spirit and scope of the invention.

Moreover, the term "or" is intended to mean an inclusive "or" rather than an exclusive "or" That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:

1. A phase locked loop circuit comprising:
   an oscillator part configured to generate a reference signal by amplifying a signal generated by an oscillator; and
   a phase locked loop part configured to include a filter that outputs a control signal to a clock transmitting circuit that generates a clock signal in accordance with a phase difference between the reference signal and a feedback signal,
   wherein a drive capability of the oscillator part is controlled in accordance with the control signal.

2. The phase locked loop circuit according to claim 1,
   wherein the oscillator part comprises
     a detecting part configured to divide a preset voltage value into multiple sections and detect a section of the multiple sections in which a voltage value of the control signal is included, and
   wherein the drive capability of the oscillator part is controlled in accordance with the section detected by the detecting part.

3. The phase locked loop circuit according to claim 1,
   wherein the oscillator part comprises
     a detecting part configured to divide a preset current value into multiple sections and detect a section of the multiple sections in which a current value of the control signal is included, and
   wherein the drive capability of the oscillator part is controlled in accordance with the section detected by the detecting part.

4. The phase locked loop circuit according to claim 1,
   wherein the drive capability of the oscillator part is controlled after an operation of the oscillator part has become stable.

5. An oscillator device comprising:
   a detecting part configured to detect an input to an oscillator part in a phase locked loop circuit;
   a drive part configured to connect to an oscillator, drive the oscillator, and output a reference signal to the phase locked loop circuit; and
   an adjusting part configured to adjust a drive capability of the drive part on the basis of a detection result from the detecting part.

6. The oscillator device according to claim 5,
   wherein the adjusting part decreases the drive capability when the input to the oscillator part changes in a direction for increasing a frequency of an output signal of the oscillator part.

7. The oscillator device according to claim 6,
   wherein the adjusting part includes a resistor part connected in parallel to the oscillator and wherein the adjusting part decreases the drive capability by increasing a resistance value of the resistor part.

8. The oscillator device according to claim 6,
   wherein the adjusting part includes a buffer connected in parallel to the oscillator and wherein the adjusting part decreases the drive capability by decreasing a drive capability of the buffer.

9. The oscillator device according to claim 5,
   wherein the detecting part detects the input to the oscillator part on the basis of a plurality of detection values, and
   wherein the adjusting part decreases the drive capability stepwise on the basis of detection results corresponding to the plurality of detection values detected by the detecting part.

10. The oscillator device according to claim 5,
    wherein the input to the oscillator part includes an analog signal based on a phase comparison result in the phase locked loop circuit.

* * * * *